(12) United States Patent
Dono

(10) Patent No.: US 8,134,882 B2
(45) Date of Patent: Mar. 13, 2012

(54) SEMICONDUCTOR DEVICE INCLUDING AN ANTI-FUSE ELEMENT

(75) Inventor: Chiaki Dono, Tokyo (JP)

(73) Assignee: Epida Memory, Inc., Tokyo (JP)

( * ) Notice: Subject to any disclaimer, the term of this patent is extended or adjusted under 35 U.S.C. 154(b) by 322 days.

(21) Appl. No.: 12/621,167

(22) Filed: Nov. 18, 2009

(65) Prior Publication Data

US 2010/0124139 A1     May 20, 2010

(30) Foreign Application Priority Data

Nov. 19, 2008   (JP) ................................. 2008-295958

(51) Int. Cl.
*G11C 17/18*     (2006.01)
(52) U.S. Cl. .................. 365/225.7; 365/96; 365/226
(58) Field of Classification Search .............. 365/225.7, 365/96, 226, 200, 230.06
See application file for complete search history.

(56) References Cited

U.S. PATENT DOCUMENTS

| | | | |
|---|---|---|---|
| 4,718,042 A * | 1/1988 | Moll et al. ..................... | 365/201 |
| 6,400,632 B1 | 6/2002 | Tanizaki et al. | |
| 6,584,029 B2 * | 6/2003 | Tran et al. .................. | 365/225.7 |
| 2002/0051399 A1 | 5/2002 | Tanizaki et al. | |
| 2003/0031074 A1 * | 2/2003 | Tran et al. .................. | 365/225.7 |

FOREIGN PATENT DOCUMENTS

JP          2002-134620            5/2002

* cited by examiner

*Primary Examiner* — Huan Hoang
(74) *Attorney, Agent, or Firm* — Morrison & Foerster LLP

(57) ABSTRACT

A semiconductor device includes a first high potential power supply, a second low potential power supply, a third power supply having a potential higher than the first, a fourth power supply having a potential more negative than the second, and an anti-fuse element having a node at each end, one of which is connected to the fourth power supply. A driver transistor has a source connected to the third power supply, a gate connected to a control node and a drain connected to one end of the anti-fuse element. A decoding circuit includes a load transistor connected between the third power supply and the control node and at least one selection transistor connected between the second power supply and the control node. A decision circuit is connected to the first and second power supplies. The decision circuit decides the resistance value of the anti-fuse element. The anti-fuse element is rendered electrically conductive in response to activation of the driver transistor as selected by the decoding circuit. The decision circuit decides whether or not the anti-fuse element has been rendered electrically conductive.

25 Claims, 9 Drawing Sheets

SEMICONDUCTOR DEVICE INCLUDING AN ANTI-FUSE ELEMENT

REFERENCE TO RELATED APPLICATION

This application is based upon and claims the benefit of the priority of Japanese patent application No. 2008-295958 filed on Nov. 19, 2008, the disclosure of which is incorporated herein in its entirety by reference thereto.

TECHNICAL FIELD

This invention relates to a semiconductor device provided with an anti-fuse element, a method for programming the anti-fuse element in the semiconductor device, and to a method for producing the semiconductor device.

BACKGROUND

In the field of semiconductor devices, an anti-fuse circuit that is normally in an insulated state and that is rendered electrically conductive when a high voltage is applied thereto in order to destruct the state of insulation during the write process, has been in use. With the anti-fuse circuit, since programming is by destructing the state of insulation, writing may be made only once, and data once written cannot be erased or otherwise restored to the original state. However, as compared to other non-volatile programming elements, the anti-fuse circuit has only low on-resistance. The anti-fuse circuit thus has come to be used extensively as a non-volatile programmable circuit for a field-programmable gate array or other semiconductor devices.

Laser fuses are routinely used for a circuit that specifies addresses for substitution by a redundancy circuit for relieving failed bits of semiconductor memories, or for a trimming circuit. However, if once the semiconductor device is assembled in a package, the laser fuses cannot be programmed. Conversely, the anti-fuse circuit can be electrically programmed. The anti-fuse circuit is attracting attention because it can be programmed even if a semiconductor device is once assembled in a package.

In Patent Document 1, there is disclosed a semiconductor device that provided with a conventional anti-fuse element, and that is used in a semiconductor memory, for example. In particular, FIG. 3 of Patent Document 1 shows a semiconductor device in which, in programming an anti-fuse element 32, a high voltage (vpgm) is applied to one end of the anti-fuse element, and in which the opposite end of the anti-fuse element is connected via an N-channel protective transistor 34 and an N-channel driver transistor 38 to the ground potential GND. A voltage applied to the gate of the N-channel driver transistor 38, selected by an address, for example, is used for programming whether or not the anti-fuse element is to be in an insulation destructed state. FIG. 13 of Patent Document 1 shows a semiconductor device in which a high voltage (vpgm) is applied to one end of the anti-fuse element 102, and in which the opposite end of the anti-fuse element is connected to a VCC potential via a P-channel protective transistor 104 and a P-channel driver transistor 108. A voltage applied to the gate of the P-channel driver transistor 108, selected by an address, for example, is used for programming whether or not the anti-fuse element is to be in an insulation destructed state. [Patent Document 1] JP Patent Kokai Publication No. JP-P2002-134620A, which corresponds to US Patent Application Publication No. US2002/0051399A1

SUMMARY

The entire disclosures of Patent Documents are incorporated herein by reference thereto.

The following analysis is made from the side of the present invention. To destruct the insulation of an anti-fuse element to establish an electrically conductive state, it is necessary to apply a high voltage across the terminals of the anti-fuse element. On the other hand, if a high voltage is applied to peripheral circuits other than the anti-fuse element, such as elements that are connected common to the nodes of the anti-fuses and that are supplied with a high voltage, there is fear that those other elements may be destructed by a high voltage. Even though those elements do not go so far as they are destroyed, the transistor characteristics may be deteriorated. In FIG. 3 of Patent Document 1, since the opposite end of the anti-fuse element selected is the ground GND potential, the high voltage (vpgm) applied to one end of the anti-fuse element may rise to an extremely high level depending on its structure and process conditions. In FIG. 13 of Patent Document 1, the opposite end of the selected anti-fuse element is the VCC potential. Even though the high voltage (vpgm: negative voltage −VCCH), applied to one end of the anti-fuse element, may be suppressed, the parasitic capacitance, for example, of the node N10, detected by a detection circuit, is high because the transistors 106, 104 and the driver transistor 108 of larger size are connected to the low potential side (node N10 on the VCCH side). In addition, the leakage current by sub-threshold currents of those transistors is not negligible. Consequently, the decision circuit that detects the resistance value of the anti-fuse element in case of transition to a higher value of the rupturing resistance of the anti-fuse circuit is lowered in detection accuracy. Hence, an anti-fuse circuit that affords a suppressed high voltage across the terminals of the anti-fuse element and that is able to suppress voltage stress, which might be imparted to peripheral circuits, or an anti-fuse circuit that may lead to improved detection accuracy of a decision circuit, without complicating the structure of the decision circuit or the manufacture process, has been a desideratum.

In a first aspect, the present invention provides a semiconductor device that includes a first power supply of a high potential, a second power supply of a low potential, a third power supply of a potential higher than the first power supply, a fourth power supply of a potential more negative than the second power supply, and an anti-fuse element having a node at one end thereof and having another node at the other end thereof, the other end being connected to the fourth power supply. The semiconductor device further includes a driver transistor whose source is connected to the third power supply, whose gate is connected to a control node and whose drain is connected to the one end of the anti-fuse element, a decoding circuit including a load transistor connected between the third power supply and the control node and at least one selection transistor connected between the second power supply and the control node, and a decision circuit connected to the first and second power supplies. The decision circuit decides the resistance value of the anti-fuse element. The anti-fuse element is rendered electrically conductive in response to activation of the driver transistor as selected by the decoding circuit, and the decision circuit makes a decision as to whether or not the anti-fuse element has been rendered electrically conductive.

In a second aspect, the present invention provides a semiconductor device that includes an anti-fuse element and run in operation by a power supplied from a first and a second power supplies. The semiconductor device includes a driver transistor whose source is connected to a third power supply and whose gate is connected to a control node, an anti-fuse element whose one end is connected to a drain of the driver transistor and whose other end is connected to a fourth power supply. The semiconductor device further includes a decision circuit connected to the first and second power supplies to decide a resistance value of the anti-fuse element, and a decoding circuit including a load transistor connected between the third power supply and the control node, and a plurality of selection transistors connected between the second power supply and the control node. The voltages of the third and fourth power supplies are voltages outside a voltage range between the first and second power supplies to allow for electrical conduction of the anti-fuse element.

In a third aspect, the present invention provides a semiconductor device run in operation by being supplied with the power from a first power supply and from a second power supply lower in supply voltage value than the first power supply. The semiconductor device includes an anti-fuse element, a plurality of drive transistors whose gates are coupled to selection signals and whose sources and drains are interconnected in series, and a decision circuit connected to the first and second power supplies to decide the resistance value of said anti-fuse element. The plurality of drive transistors, with sources and drains connected in series, and the anti-fuse element, are interconnected in series between a first node and a second node. The plurality of drive transistors are also used as a decoding circuit. The selection signals are selected so that, for the anti-fuse element to be electrically conductive, the drive transistors connected in series with the anti-fuse element will be made electrically conductive in their entirety. The first node is supplied with a voltage higher than the voltage of the first power supply and the second node is supplied with a voltage lower than the voltage of the second power supply to render the anti-fuse element electrically conductive.

The meritorious effects of the present invention are summarized as follows.

According to at least one representative meritorious effect of the present invention, the anti-fuse element is rendered electrically conductive by applying a voltage outside a voltage between the first and second power supplies across both ends of a series connection of the driver transistor and the anti-fuse element. It is thus possible to secure the voltages applied to both ends of the anti-fuse element. Moreover, the voltage applied across both ends of the anti-fuse element may be a suppressed high voltage to suppress the voltage stress otherwise applied to the peripheral circuit. The decoding element for selecting the anti-fuse element is arranged in a generation section of the gate control signal of the driver transistor, and hence the parasitic capacitance attendant on the anti-fuse element or the leakage current may be suppressed. Hence, the decision circuit detecting the resistance value of the anti-fuse may be improved in accuracy.

BRIEF DESCRIPTIONS OF THE DRAWINGS

PREFERRED MODES

Figure 1:
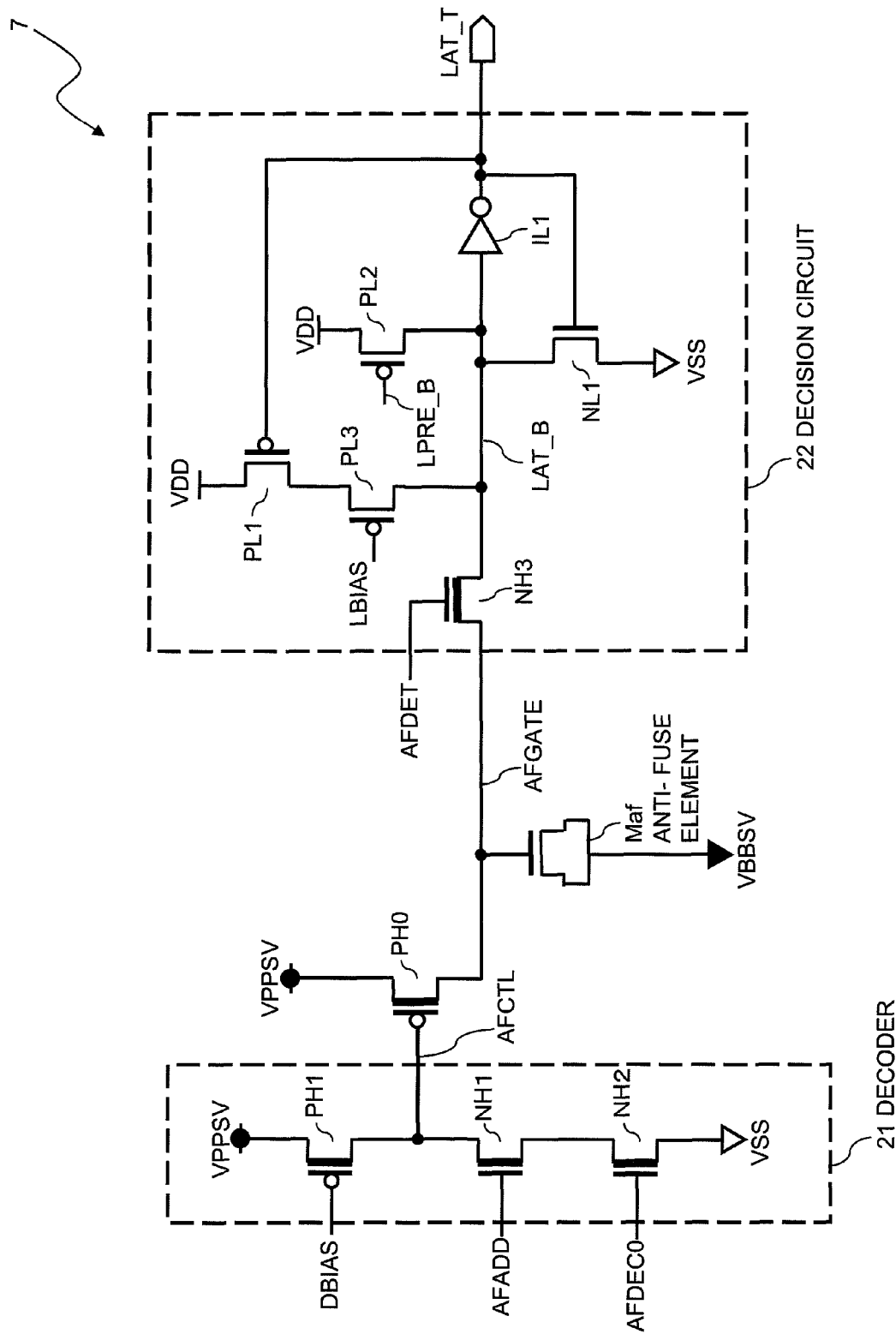
FIG. 1 is a circuit diagram of the vicinity of an anti-fuse element in a semiconductor device according to an Example of the present invention.

A representative example of the concept to solve the problem of the present invention may be outlined as follows:

The voltages applied to both ends of the anti-fuse element in order to rupture the anti-fuse element are set so as to be higher than the voltages of the first and second power supplies routinely used in the peripheral circuit. It is thus possible to assure reliability in rupturing the anti-fuse (low resistance at the time of rupturing) as the respective high voltage values are suppressed. In addition, no element other than the driver transistor that ruptures the anti-fuse is added, as a matter of the principle, to a node to which is connected a decision circuit that detects the resistance value of the anti-fuse element. There is thus presented no problem such as low reliability or possible destruction of the elements connected to the node. In addition, parasitic capacitance values of the node may be suppressed to the utmost extent, and no leakage current is generated at the node, thus improving the accuracy of the decision circuit. Moreover, the selection transistors, deciding on whether or not the anti-fuse element is to be ruptured, are connected to the control node which is the gate signal of the driver transistor. Hence, no parasitic capacitance is generated at the node. Further, a load transistor is arranged at the control node. On the other hand, in detecting the resistance value of the anti-fuse element, the current adjusted by a decision current adjustment signal is caused to flow through the anti-fuse element.

An exemplary embodiment of the present invention will now be described with reference to the drawings. It should be noted that the drawings or reference numerals used therein are for the sake of illustration of the exemplary embodiment only and are not intended to limit various variations of the exemplary embodiment of the present invention.

Figure 9:
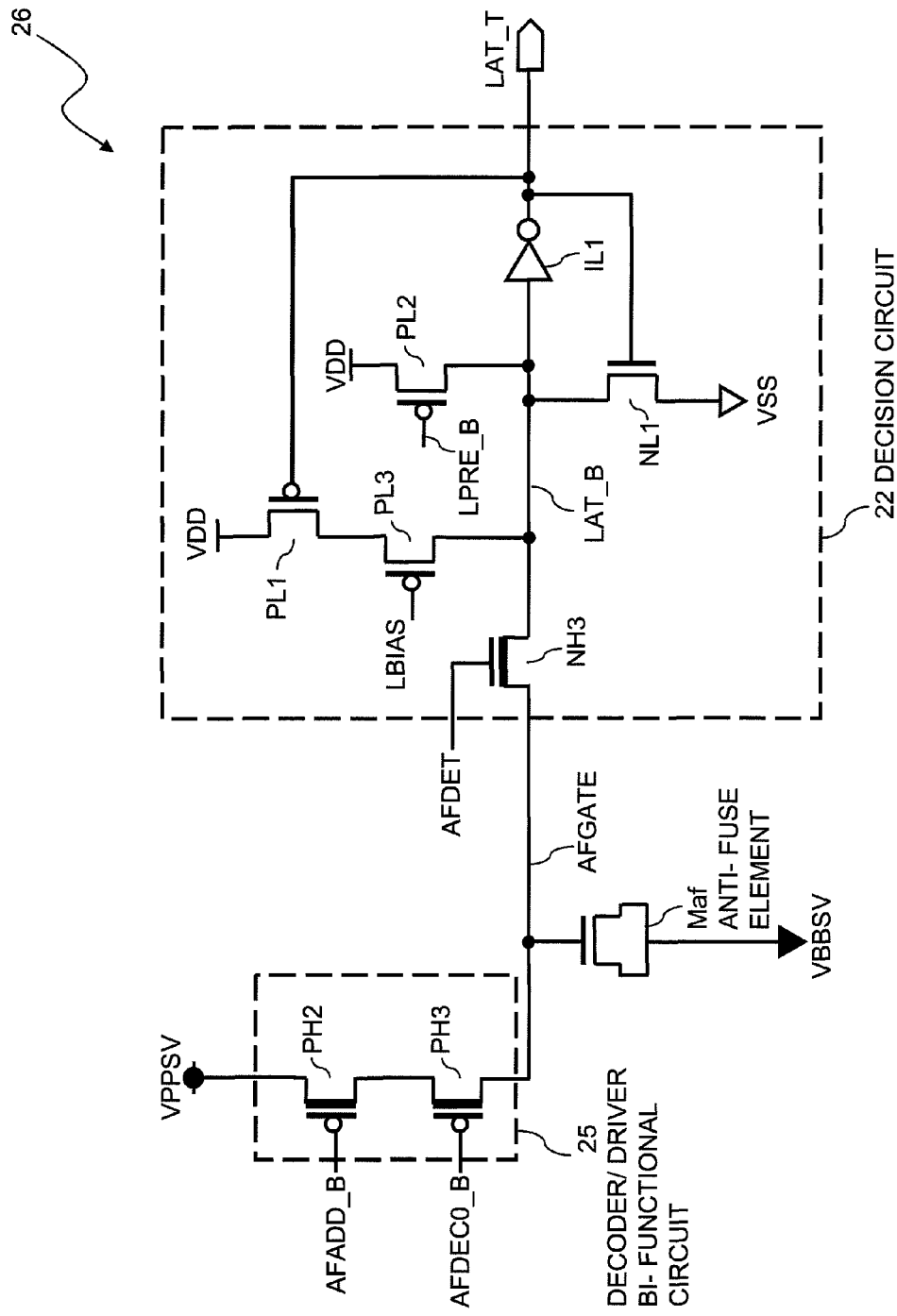
FIG. 9 is a circuit diagram of the vicinity of an anti-fuse element in a semiconductor device according to another Example of the present invention.

Referring to FIG. 1 or 9, a semiconductor device (31, or FIG. 2 in its entirety) according to an exemplary embodiment of the present invention includes an anti-fuse element (Maf) and is run in operation by being supplied with power from a first power supply (VDD) and a second power supply (VSS). The semiconductor device also includes a driver transistor (PH0 or PH2 and PH3) whose source is connected to a third power supply VPPSV and whose gate is connected to a control node AFCTL. The anti-fuse element (Maf) has one end connected to the drain (AFGATE) of the driver transistor and has the other end connected to a fourth power supply VBBSV. The semiconductor device further includes a decision circuit 22 connected to the first power supply VDD and to the second power supply VSS to decide the resistance value of the anti-fuse element Maf. The voltage of the third power supply VPPSV and the voltage of the fourth power supply VBBSV are set so as to be outside the voltage range of the first and second power supplies to render the anti-fuse element electrically conductive. Of course, the supply power may directly be supplied from outside the semiconductor device to the third and fourth power supplies, or a voltage increasing or decreasing circuit may be provided within the semiconductor device 31 to generate the power supply voltage from the first and second power supplies.

In a semiconductor device according to an exemplary embodiment of the present invention, shown in FIGS. 1 and 9, the voltages of the first to fourth power supplies (VDD, VSS, VPPSV and VBBSV) are set so that the voltages become lower in the sequence of the third power supply VPPSV, the first power supply VDD, the second power supply VSS and the fourth power supply VBBSV in order to render the anti-fuse element Maf electrically conductive. That is, with the circuit shown in FIG. 1, the highest voltage and the lowest voltage are applied to the third power supply VPPSB and to the fourth power supply VBBSV, respectively, thereby causing insulation destruction of the anti-fuse element to render it electrically conductive. However, if the electrical conduction types of the anti-fuse circuit are all reversed, the highest voltage may be afforded to the fourth power supply, with the voltage becoming progressively lower in the sequence of the second power supply, first power supply and the third power supply, in which case the same advantage may be obtained.

Further, in a semiconductor device of an exemplary embodiment of the present invention, shown in FIG. 1, there may further be provided a decoding circuit 21 including a load transistor PH1 and a plurality of selection transistors NH1, NH2. The load transistor PH1, connected between the third power supply VPPSV and the control node AFCTL, is a high withstand voltage MOS transistor (thick film transistor). The selection transistors NH1, NH2, connected between the second power supply VSS and the control node AFCTL, are also high withstand voltage MOS transistors (thick film transistors). By the decoding circuit, it may be decided whether the driver transistor is to be turned on to apply voltage to the anti-fuse element to effect data write. It is noted that, in FIG. 1, a plurality of selection transistors are connected in series. However, depending on the construction of the decoding circuit, the multiple selection transistors may be connected in parallel or in a matrix configuration.

Figure 4:
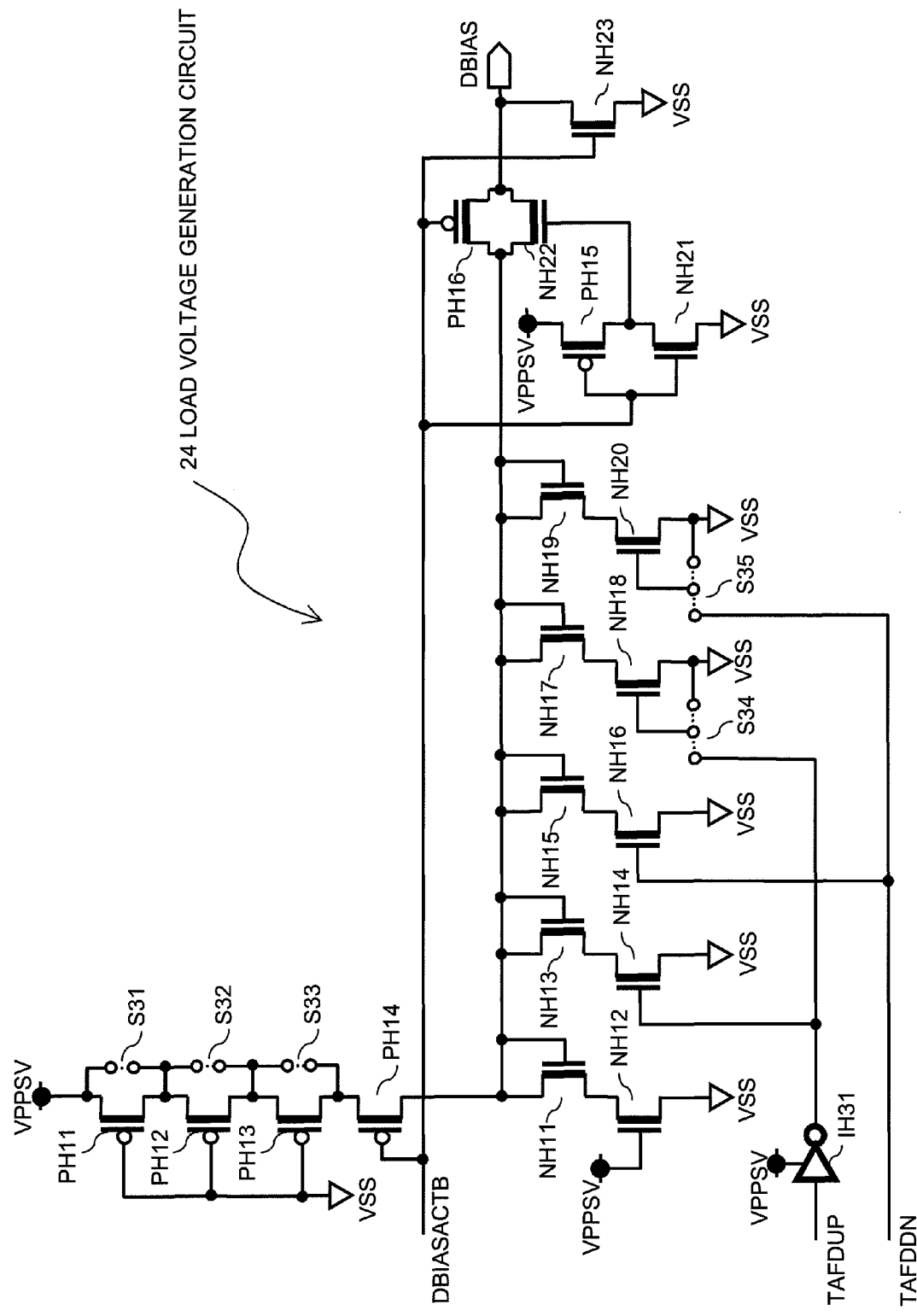
FIG. 4 is a circuit diagram of a load voltage generation circuit according to the Example of the present invention.

In a semiconductor device according to an exemplary embodiment of the present invention, there may be provided a load voltage generation circuit 24 (FIG. 4) that divides the voltage of the third power supply VPPSV and the voltage of the second power supply VSS, as shown in FIG. 4. An output signal DBIAS of the load voltage generation circuit 24 may be connected to the gate of the load transistor PH1. That is, the bias voltage of the load transistor may be controlled by the load voltage generation circuit. On the other hand, the bias voltage of the driver transistor may directly be controlled by the bias voltage of the load transistor.

In a semiconductor device according to an exemplary embodiment of the present invention, a driver transistor circuit 25 includes a plurality of series-connected transistors (PH2, PH3), as shown in FIG. 9, and operates as a decoder/driver bi-functional circuit. With this circuit configuration, in which the driver transistor also performs the function of the decoding circuit, the number of circuit elements necessary for writing in the anti-fuse element may be reduced.

Further, in a semiconductor device according to an exemplary embodiment of the present invention, the anti-fuse element Maf may be a MOS transistor whose gate is connected to AFGATE as one end and whose source/drain is connected to VBBSV as the other end, as shown in FIGS. 1 and 9. That is, the gate insulating film of the MOS transistor may be used as an anti-fuse. Thus, if a MOS transistor of the same construction as the MOS transistor, used as a circuit element in the semiconductor device, is used as an anti-fuse, the number of manufacturing steps is not increased by providing the anti-fuse.

In a semiconductor device according to an exemplary embodiment of the present invention, the decision circuit 22 includes an input transistor NH3, as shown in FIGS. 1 and 9. This input transistor has a source or a drain connected to one end AFGATE of the anti-fuse element, while having the drain or the source connected to a potential decision node LAT_B of the decision circuit. Each of the driver transistor PH0 and the input transistor NH3 is a high withstand voltage MOS transistor (thick film transistor), while the anti-fuse element Maf is composed of a low withstand (breakdown) voltage MOS transistor (thin film transistor). That is, since each of the driver transistor PH0 and the input transistor NH3, a high voltage is applied to, is a high withstand (breakdown) voltage MOS transistor, no adverse effect is caused to the peripheral circuits (explained later) even if a high voltage is applied to the anti-fuse element. Moreover, since the anti-fuse element Maf is composed of the low withstand voltage MOS transistor, the insulating film can be destructed relatively readily to render the anti-fuse element electrically conductive.

In a semiconductor device according to an exemplary embodiment of the present invention, the decision clock signal AFDET is coupled to the gate of the input transistor NH3, as shown in FIGS. 1 and 9. Hence, the decision circuit 22 is able to latch the result of the decision in synchronization with the decision clock signal AFDET. That is, when it is necessary to check for the possible electrically conductive state of the anti-fuse element, the decision clock signal may be rendered active to latch the result of decision. It is unnecessary to render the decision clock signal active in order to apply a high voltage to the anti-fuse element to render it electrically conductive. Hence, the input transistor is in an off-state, so that a high voltage is not applied to the decision circuit. On the other hand, the decision circuit has the function of deciding the resistance value of the anti-fuse element to latch the result of the decision. Hence, if a decision clock is delivered once to latch the result of decision of the resistance value, after the power supply is on, it is unnecessary to decide the resistance value of the anti-fuse element again, except if the power supply is again turned on or the system is initialized. It is noted that latch control and the control of the input transistor NH3 may be separated from each other.

Figure 2:
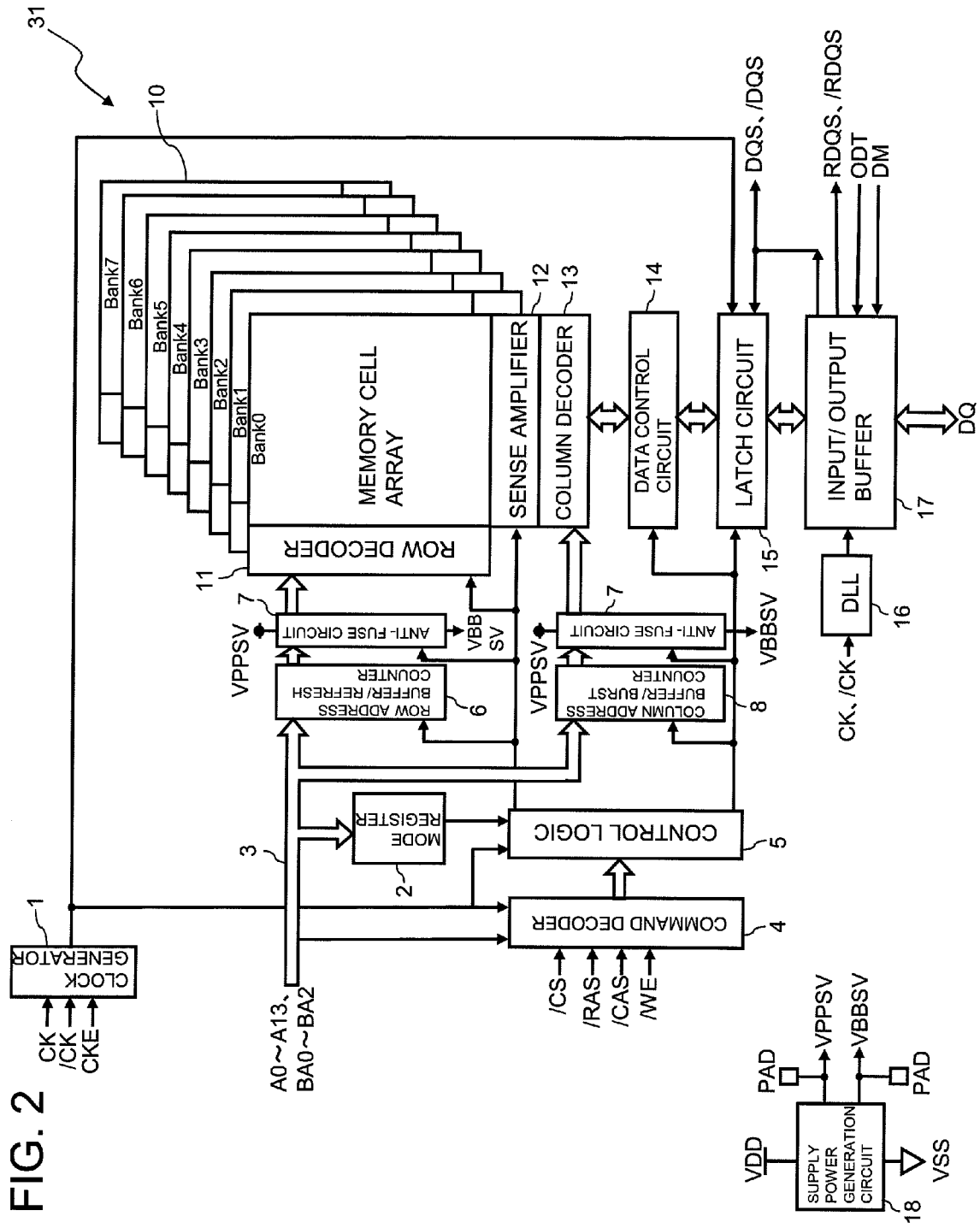
FIG. 2 is a block diagram of the semiconductor device, in its entirety, according to the Example of the present invention.

In a semiconductor device according to an exemplary embodiment of the present invention, a semiconductor device further includes a memory cell array 10 and peripheral circuits, such as data control circuit 14, latch circuit 15, control logic 5 or command decoder 4, as shown in FIG. 2. These peripheral circuits control access to memory cells of the memory cell array from outside. The anti-fuse element Maf may be composed of a MOS transistor of the same construction as the MOS transistors used for the peripheral circuits, that is, a low withstand voltage MOS transistor (thin film transistor). Hence, the anti-fuse element may be manufactured at the same time as the peripheral circuits, with the consequence that the number of the manufacture steps is not increased as a result of providing the anti-fuse element.

Figure 3:
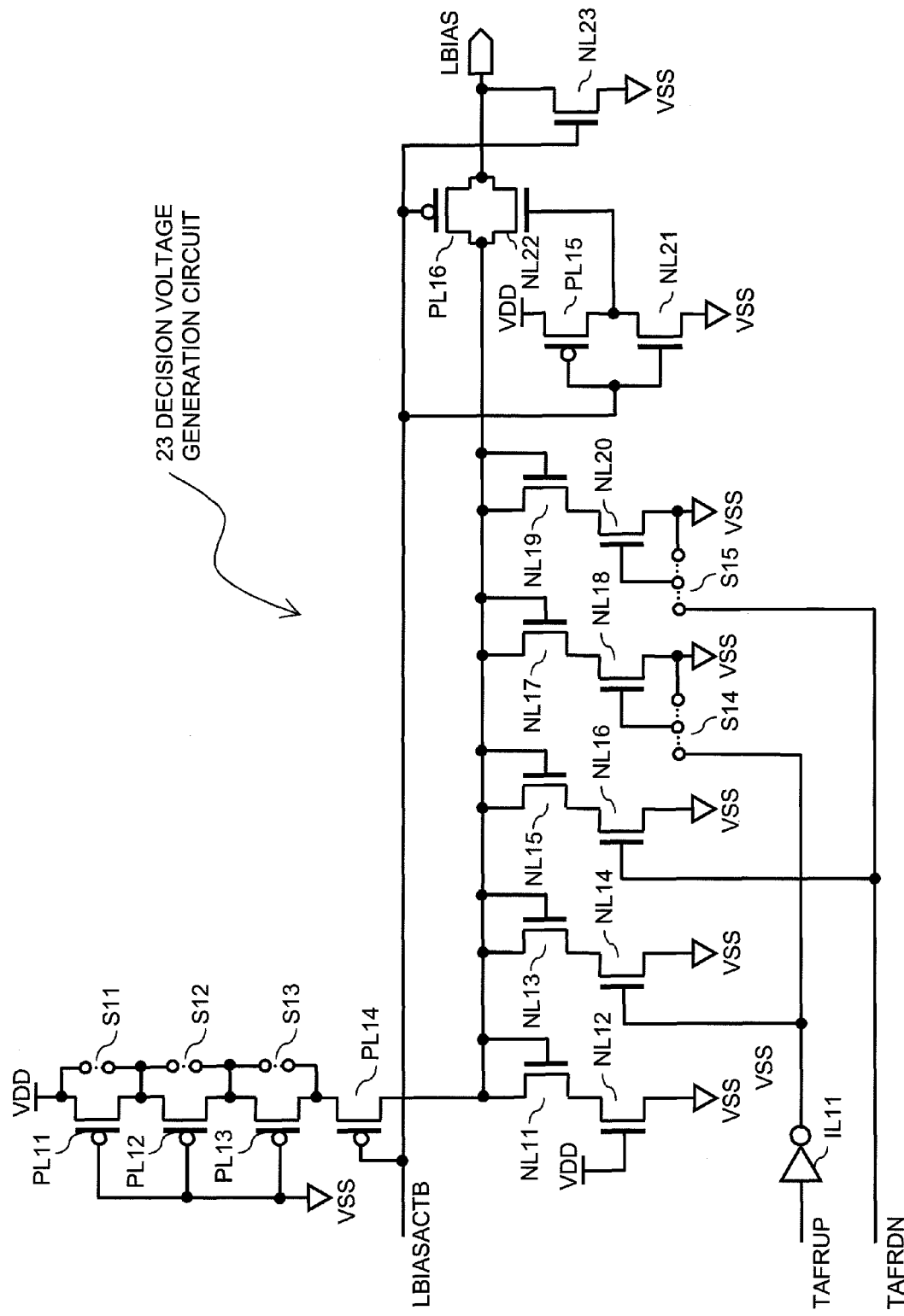
FIG. 3 is a circuit diagram of a decision voltage generation circuit according to the Example of the present invention.

In a semiconductor device according to an exemplary embodiment of the present invention, a decision current adjustment signal LBIAS is coupled to the decision circuit 22, as shown in FIGS. 1 and 3. The decision circuit 22 causes a current adjusted by the decision current adjustment signal LBIAS to flow to the anti-fuse element to allow a decision based on a potential difference generated. That is, the current flowing from the decision circuit 22 to the anti-fuse element is controlled by adjusting the voltage level of the decision current adjustment signal LBIAS. The potential difference caused by the current flowing through the anti-fuse element is measured by the decision circuit to decide whether or not the anti-fuse element is in the electrically conductive state. It is noted that the current flowing to the anti-fuse element is also the feedback current of the latch circuit made up of the transistors PL1, NL1 and the inverter IL1. The voltage value of the decision current adjustment signal LBIAS, supplied to the gate of the transistor PL3, is a crucial factor that governs the decision characteristic of the latch circuit, that is, the characteristic that decides a threshold value in 1/0 decision of the resistance value of the anti-fuse element by the current. Further, the transistor PL3 may be separated within the decision circuit 22 from the latch circuit. As a matter of course, if the circuit type is reversed, that is, the circuit type is such that the current is extracted from the anti-fuse element, the interrelationship among the power supplies, to which are connected circuit elements, such as transistor PL3, and the circuit elements, is also reversed.

In a semiconductor device according to an exemplary embodiment of the present invention, there is further provided a decision voltage generation circuit 23 that divides a voltage of the first power supply VDD and a voltage of the second power supply VSS, as shown in FIG. 3. The decision voltage generation circuit 23 is able to output the decision current adjustment signal LBIAS. That is, by adjusting the decision voltage generation circuit 23, the voltage level of the decision current adjustment signal LBIAS may be adjusted, as a result of which it is possible to adjust the decision level in making the decision as to whether or not the anti-fuse element is rendered electrically conductive.

In a semiconductor device according to an exemplary embodiment of the present invention, the semiconductor device 31 includes a semiconductor substrate and a plurality of interconnect layers. The gate of the anti-fuse element Maf is connected, using only the lowermost one of the multiple interconnect layers, at least one point to the semiconductor substrate. That is, referring to FIG. 1, the gate AFGATE of the anti-fuse element Maf is connected to the semiconductor substrate via an interconnect, the drain of the driver transistor PH0, and via the source/drain of the input transistor NH3 of the decision circuit 22. At least one of the interconnect, the drain of the driver transistor and the source/drain of the input transistor is connected to the semiconductor substrate via just the lowermost one of the multiple interconnect layers. With this construction, a discharge path from the gate of the anti-fuse element to the semiconductor substrate has been formed if once the interconnect of the lowermost layer is completed. There is thus no fear that the gate of the anti-fuse element is charged up and destructed during the ion implantation step or the lithographic step in the course of the manufacture process of the semiconductor device.

In a semiconductor device according to an exemplary embodiment of the present invention, first to fourth power supplies (VDD, VSS, VPPSV and VBBSV) are connected to first to fourth power supply pads, respectively, as shown in FIG. 2. First and second power supply pads (power supply pads, not shown, of VDD and VSS) are connected to power supply lines, not shown, provided outside of the semiconductor device. The third and fourth power supply pads (VPPSV, VBBSV) are not connected to the power supply lines provided outside of the semiconductor device, and are connected to a supply power generation circuit 18 configured to generate power supply voltages within the semiconductor device. That is, the third and fourth power supplies may be generated by the supply power generation circuit 18 without it being necessary to provide the voltages directly from outside. However, if the anti-fuse element is to be rendered electrically conductive for a semiconductor wafer or chip, there are larger numbers of current conducting sites. Hence, there are provided power supply pads that may supply third and fourth power supplies from outside as well. Once assembled to form a package, these power supply pads may not be connected to the external terminals.

In a method for programming the anti-fuse element in the semiconductor device, according to an exemplary embodiment of the present invention, the semiconductor device includes a driver transistor PH0 whose source is connected to a first node VPPSV and whose gate is connected to a control node AFCTL, and an anti-fuse element Maf whose one end is connected to the drain of the driver transistor PH0 and whose other end is connected to a second node VBBSV. A voltage outside the voltage range of the first power supply VPP and the second power supply VBB is applied to the first node VPPSV, and another voltage outside the voltage range of the first power supply VPP and second power supply VBB is applied to the second node VBBSV. A voltage at the control node is controlled to render the anti-fuse element Maf electrically conductive. In this manner, the first node VPPSV and the second node VBBSV are each supplied with the voltage outside the voltage range of the first power supply VPP and the second power supply VBB. Hence, the anti-fuse may be rendered electrically conductive even if voltages not so high in absolute values are applied to the first node VPPSV and the second node VBBSV. Since the voltage high in absolute value is not applied to the first node VPPSV or to the second node VBBSV, no marked stress is applied to the peripheral circuit of the anti-fuse element.

In a programming method for a semiconductor device according to an exemplary embodiment of the present invention, the semiconductor device 31 includes a plurality of sets each made up of the driver transistors PH0 and an anti-fuse elements Maf, a memory cell array 10, and a redundant memory cell, not shown. The programming method includes the step of performing a functional test of the memory cell array and deciding a memory cell to be replaced by the redundant memory cell if, as a result of functional deficiency in the memory cell array 10 as found by the functional test, the memory cell array suffers a functional deficiency. The programming method also includes the step of rendering one anti-fuse element selected from the multiple anti-fuse elements electrically conductive in association with the memory cell. Within the memory cell array 10, there are larger numbers of redundant memory cells arranged on the column or row basis. The memory cells, found to be deficient as a result of the functional test, are replaced by redundant memory cells. The addresses of the memory cells to be replaced are programmed in the anti-fuse elements.

In a method for producing a semiconductor device according to an exemplary embodiment of the present invention, the semiconductor device 31 includes an anti-fuse element Maf. The semiconductor device is in operation during the time of the normal operation by being supplied with power from first and second power supplies (VDD, VSS). The method for producing the semiconductor device includes a step of forming, on the semiconductor substrate, a driver transistor PH0 whose source is connected to a first node VPPSV and whose gate is connected to a control node AFCTL, and an anti-fuse element Maf whose one end is connected to the drain AFGATE of the driver transistor PH0 and whose other end is connected to the second node VBBSV. The method for producing the semiconductor device also includes a step of applying a voltage outside the voltage range of the first power supply VDD and the second power supply VBB to each of the first node VPPSV and the second node VBBSV to control the voltage at the control node AFCTL to render the anti-fuse element Maf electrically conductive. For example, if an anti-fuse is to be used for trimming or replacement of failed memory cells, half-products, found to suffer from non-compliance with the standard prescriptions or defects as a result of a function previous to adjustment by the anti-fuse element, are run in operation as the current is allowed to flow through preset anti-fuse elements based on measured results. By so doing, the half-products may be brought to completion as semiconductor devices free of non-compliance with the standard prescriptions or defects.

In a method for producing a semiconductor device according to an exemplary embodiment of the present invention, shown in FIGS. 1 and 2, during the step of forming the driver transistor PH0 and the anti-fuse element Maf on the semiconductor substrate, a plurality of sets, each composed of the driver transistors PH0 and the anti-fuse element Maf, and a memory cell array 10 and a redundant memory cell, not shown, are formed. Then, a functional test of the memory cell array 10 is performed. The memory cell to be replaced by the redundant memory cell is decided based on the result of the functional test. The anti-fuse element selected out of the multiple anti-fuse elements is rendered electrically conductive in association with the result of the functional test. That is, preset anti-fuse elements are rendered electrically conductive, based on the result of functional tests of the memory cell array to complete a memory cell array free of functional failures from the state of the functionally deficient memory cell array that existed before the adjustment by the anti-fuse elements.

A method for producing a semiconductor device according to an exemplary embodiment of the present invention includes a step of applying the voltages outside the voltage range from VDD to VSS from a pad of the semiconductor device in the state of a wafer or a pellet to the first node VPPSV and to the second node VBBSV to render the anti-fuse element electrically conductive, as shown in FIG. 2. That is, if the anti-fuse element is to be rendered electrically conductive, based on the result of test on a semiconductor device in the state of a wafer, an electrical voltage is applied from outside the semiconductor device to the pad, specifically, to the first node VPPSV and to the second node VBBSV, to render the anti-fuse element electrically conductive to complete a semiconductor device free of functional deficiencies.

In a method for producing a semiconductor device by an exemplary embodiment of the present invention, the semiconductor device 31 includes a supply power generation circuit 18 that generates a voltage outside the voltage range from VDD to VSS at the first node VPPSV and at the second node VBBSV. The method for producing a semiconductor device includes a step of setting the supply power generation circuit 18 into operation after assembling the semiconductor device 31 into a package to render the anti-fuse element Maf electrically conductive. That is, if once the semiconductor device is assembled into a package, it is not possible to supply an electrical voltage from outside, because the first node VPPSV or the second node VBBSV usually is not provided as a terminal. However, a supply power generation circuit is provided within the semiconductor device. This supply power generation circuit may be set into operation to deliver the electrical power necessary to render the anti-fuse electrically conductive to the first and second nodes. Hence, a half-product, suffering from deficiencies, may be brought to completion as a functionally sufficient semiconductor device even after assembling the semiconductor device. With reference to the drawings, certain Examples of the present invention will now be described in detail.

Example 1

FIG. 2 depicts a block diagram of a semiconductor device of Example 1 in its entirety. A semiconductor device 31 of FIG. 2 is a synchronous DRAM. The schematics of the configuration of the semiconductor device 31 of FIG. 2 are now briefly described. A clock generator 1 inputs clock signals CK and /CK as well as a clock enable signal CKE from outside to deliver the signals to the semiconductor device 31 in its entirety. An address bus 3 inputs address signals A0 to A13 and bank address signals BA0 to BA2 from outside to transmit these signals to a mode register 2, a row address buffer/refresh counter 6 and to a column address buffer/burst counter 8. The mode register 2 receives the address data from the address bus 3 to set an inner operating mode. A command decoder 4 inputs a chip select signal /CS, a row address strobe signal /RAS, a column address strobe signal /CAS and a write enable signal /WE from outside to decode a command supplied from outside. The control logic 5 controls the semiconductor device 31, in its entirety, based on the command decoded by the command decoder. The row address buffer/refresh counter 6 accepts a row address from the address bus 3, while counting a refresh address. The column address buffer/burst counter 8 accepts a column address from the address bus 3, while counting the column address for burst transfer. DRAM cells are placed on rows and columns of a memory cell array 10. The addresses of the memory cell array are specified by a row decoder 11 and a column decoder 13. The memory cell array 10 includes eight banks of Bank 0 to Bank 7. Meanwhile, in reading out or refreshing data from the memory cell array, the sense amplifier 12 amplifies data read out via the memory cell array via bit lines. A data controlling circuit 14 controls data to be input to or output from the memory cell array. A latch circuit 15 transiently holds data to be input to or output from outside. A DLL 16 generates, from the clock signals CK and /CK, a clock signal for synchronization with outside, and delivers the so generated clock signal to an input/output buffer 17. The input/output buffer 17 is connected to an outside data bus DQ and inputs/outputs data in synchronization with strobe signals DQS, /DQS and differential data strobe signals RDQS, /RDQS. The input/output buffer 17 is supplied with a terminal resistance control signal ODT and a data mask signal DM.

Redundancy memory cell rows and redundancy memory cell columns, not shown, are included in the memory cell array 10 of each bank. If, as a result of testing the memory cell array 10, part of memory cells is found to be failed cells, those failed cells are replaced by the redundancy memory cell rows and redundancy memory cell columns, with the rows or columns including the failed memory cells as units. An anti-fuse circuit 7, associated with the row decoder 11, has stored therein row addresses containing failed memory cells and which are to be replaced by the redundancy memory cell rows, and another anti-fuse circuit 7, associated with the column decoder 13, has stored therein column addresses containing failed memory cells and which are to be replaced by redundancy memory cell columns. In case the row address or the column address containing the failed memory cell is specified from the row address buffer/refresh counter 6 or the column address buffer/burst counter 8, the corresponding anti-fuse circuit 7 outputs the redundancy memory row or the redundancy memory column as row address or the column address in place of the row address or the column address of the failed memory cell. Hence, the anti-fuse circuit 7 includes a number of bits associated with the number of bits of the row address or column address that needs to be replaced. If a plurality of redundancy memory cell rows or a plurality of memory cell columns is to be provided, the anti-fuse circuit 7 is provided for each of the rows or the columns. The anti-fuse circuit 7 is provided from one bank to another, although this is not shown in FIG. 2.

A supply power generation circuit 18 generates supply powers VPPSV and VBBSV, necessary for writing in the anti-fuse circuit 7, from a first power supply VDD and a second power supply VSS. The supply power generation circuit delivers the so generated supply powers to the anti-fuse circuit 7. The supply powers VPPSV and VBBSV, output from the supply power generation circuit 18, are coupled to terminal pads, so that, when the semiconductor device 31 is in the state of a wafer or a chip, supply powers may directly be delivered from outside as VPPSV and VBBS.

The semiconductor device 31, shown in FIG. 2, may be formed as a circuit on a silicon semiconductor substrate by a manufacturing method as known per se.

FIG. 1 depicts a circuit diagram of a one-bit equivalent portion of the anti-fuse circuit 7 in Example 1. The configuration of the anti-fuse circuit 7 for one bit is now described. During readout or write of the anti-fuse, the decoding circuit 21 selects that one of the anti-fuses that is to be accessed. The decoding circuit 21 includes a thick film PMOS transistor PH1 whose source is connected to the third power supply VPPSV and whose gate is coupled to an output signal DBIAS of a load voltage generation circuit 24 (See FIG. 4). The decoding circuit 21 also includes a thick film NMOS transistor NH2 whose source is connected to a second power supply VSS and whose gate is coupled to a selection signal AFDEC0. The decoding circuit 21 further includes a thick film NMOS transistor NH1 whose source is connected to a drain of the thick film NMOS transistor NH2, whose gate is coupled to a selection signal AFADD and whose drain is connected in common with the drain of the thick film PMOS transistor PH1.

The drains of the thick film PMOS transistor PH1 and the thick film NMOS transistor NH1, connected common, provide an output of the decoding circuit 21, and are connected to the gate of a driver transistor PH0. This driver transistor PH0 is a thick film PMOS transistor whose source is connected to the third power supply VPPSV.

The drain of the driver transistor PH0 is connected to an anti-fuse element Maf. This anti-fuse element Maf is composed of a thin film NMOS transistor whose gate is connected to a drain of the driver transistor PH0 and whose drain and source are connected to a fourth power supply VBBSV. It is observed that the anti-fuse element Maf is of the same configuration as the thin film NMOS transistor used in other circuits in the semiconductor device 31.

The gate of the anti-fuse element Maf is also connected to a data input terminal of a decision circuit 22. During the readout operation, the decision circuit 22 verifies the potential of the gate AFGATE of the anti-fuse element Maf, that is, the resistance value between the gate and the source-drain of the anti-fuse element Maf.

The decision circuit 22 includes an input transistor NH3, which is a thick film NMOS transistor whose source or the drain is connected to the gate AFGATE of the anti-fuse element Maf and whose gate is coupled to a decision clock signal AFDET. The decision circuit also includes a thin film NMOS transistor NL1 whose source is connected to the second power supply VSS and whose drain is connected to the drain or the source of the input transistor NH3. The decision circuit also includes a low withstand voltage inverter IL1 whose input is connected to the drain or the source of the input transistor NH3 and whose output is connected to the gate of the thin film NMOS transistor NL1 and to the gate of a thin film PMOS transistor PL1. The decision circuit 22 also includes the thin film PMOS transistor PL1 whose source is connected to the first power supply VDD. The decision circuit 22 further includes a thin film PMOS transistor PL3 whose source is connected to the drain of the thin film PMOS transistor PL1, whose gate is connected to a decision current adjustment signal LBIAS and whose drain is connected common to the drain or the source of the input transistor NH3, the drain of the thin film NMOS transistor NL1 and to the drain of a thin film PMOS transistor PL2. The thin film PMOS transistor PL2 has a source connected to the first power supply VDD, while having a gate coupled to a pre-charge signal LPRE_B. An output of the low withstand voltage inverter IL1 is output as an output signal LAT_T of the decision circuit 22. It is observed that the PMOS transistors PL1 to PL3, NMOS transistor NL1 and the inverter IL1 are all low withstand voltage MOS transistors.

As will be set out later, a voltage not lower than the first power supply VDD is applied during writing to the third power supply VPPSV. A voltage not higher than the second power supply is applied to the fourth power supply VBBSV. The driver transistor PH0 is controlled to be on or off by the voltage of the control node AFCTL which is an output signal of the decoding circuit 21. When the driver transistor PH0 is turned on, a high voltage is applied between the gate and the source/drain of the anti-fuse element Maf, thus destructing the insulation at the gate of the anti-fuse element Maf to render a path between the gate and the source/drain thereof electrically conductive.

In the semiconductor device of Example 1, larger numbers of MOS transistors and capacitors are preferably formed on a silicon semiconductor substrate by a technique known per se. A plurality of interconnect layers (or wiring layers) are arranged via an insulating layer on the MOS transistors and capacitors provided on the silicon substrate. The MOS transistors and capacitors are connected to external terminals via larger numbers of interconnects formed in the interconnect layers to implement preset functions. Out of these transistors etc., the anti-fuse element Maf of FIG. 1 has its gate AFGATE connected to the semiconductor substrate, via interconnects, to a drain of the driver transistor PH0 and to a source/drain of the input transistor NH3 of the decision circuit 22. At least one of the interconnect of the AFGATE to the drain of the driver transistor PH0 and the interconnect thereof to the source/drain of the input transistor NH3 of the decision circuit 22 is via solely the lowermost interconnect layer. With this configuration, a discharge path from the gate of the anti-fuse element to the semiconductor substrate has already been established when the lowermost interconnect layer has been formed. There is thus no fear of the gate of the anti-fuse element being charged up and destroyed by an implantation step or a lithographic step in the manufacture process subsequent to the process of forming the lowermost layer interconnects.

By the thick film PMOS transistor and the thick film NMOS transistor in the present specification are meant a high withstand voltage transistor with a thick insulating film that is not destructed when a high voltage is applied thereto. By the thin film PMOS transistor and the thin film NMOS transistor are meant a low withstand voltage transistor with a thin insulating film that may be in operation at a high operating speed. In the present drawings, the high withstand voltage transistors are denoted by gates of increased thicknesses as drawing symbols for distinction from the low withstand voltage transistors. On the other hand, logic gates composed of high withstand voltage transistors are indicated by thick lines as drawing symbols for distinction from the logic gates composed of the low withstand voltage transistors (for example, see IH31 of FIG. 4).

FIG. 3 depicts a circuit diagram of a decision voltage generation circuit 23 that generates a decision current adjustment signal LBIAS of FIG. 1. Although the decision voltage generation circuit 23 is not shown in FIG. 2, the decision voltage generation circuit 23 is provided within the semiconductor device 31.

The configuration and the operation of the decision voltage generation circuit 23 will now be described. The decision voltage generation circuit 23 is activated when a decision voltage generation circuit activation signal LBIASACTB is brought low in level to generate a voltage of the first power supply VDD and a voltage of the second power supply VSS by resistance division. The decision voltage generation circuit outputs a resulting signal as decision current adjustment signal LBIAS to the decision circuit 22. Specifically, the voltage between VDD and VSS is divided by a series connection of thin film PMOS transistors PL11, PL12, PL13 and PL14, a parallel connection of thin film NMOS transistors NL12, NL14, NL16, NL18 and NL20 and a set of thin film NMOS transistors NL11, NL13, NL15, NL17 and NL19 that have source/drain paths connected together. A voltage resulting from the voltage division is output as LBIAS via a transmission gate made up of PL16 and NL22. Switch interconnects PL11, PL12 and PL13 are provided with switch interconnects S11, S12, S13 that enable switching between shorting and not shorting of the source/drain paths subject only to change in the metal interconnect layers. In similar manner, switch interconnects S14, S15 enable switching of the destination of connection of gates of the thin film NMOS transistors NL18 and NL20 by metal interconnect layers.

TAFRUP and TAFRDN denote signals that adjust the voltage level of the decision current adjustment signal LBIAS. When TAFRUP is brought high in level, NL14 and NL18 are turned off to cause the voltage of the decision current adjustment signal LBIAS to rise to high level. On the other hand, when TAFRDN is brought high in level, NL16 and NL20 are turned on to cause the voltage of the decision current adjustment signal LBIAS to fall to a low level.

FIG. 4 depicts a circuit diagram of the load voltage generation circuit 24 that generates the DBIAS signal that is to be supplied to the decoding circuit 21 of FIG. 1. The load voltage generation circuit 24 is similar in construction and operation to the decision voltage generation circuit 23 except that the load voltage generation circuit differs in the destination of input and output signals and in signal names and is constructed in its entirety by thick film high withstand voltage transistors, and that the supply power is delivered from the third power supply VPPSV instead of from the first power supply VDD. Hence, detailed description of the load voltage generation circuit is dispensed with.

The operation to write in and read from the anti-fuse element of Example 1 will now be described with reference to the timing charts of FIGS. 5 to 8. Meanwhile, in the following description on the operation, power supply voltages in writing in the anti-fuse are assumed to be such that VPPSV=4V, VBBSV=0 to −2V, VDD=1.5V and VSS=0V. Power supply voltages in readout are such that VPPSV=1.5V, VBBSV=0V, VDD=1.5V and VSS=0V. Meanwhile, in the timing charts, illustrated in the following, the VPP potential is used as a voltage to be used as the amplitude of AFADD, AFDEC0 and AFDET. For VPP, 2.6V is afforded for both the write and readout operations. It is observed that VPP is a potential used for a word line of the memory cell array. This potential is supplied by the power supply voltage generation circuit within the semiconductor device 31. The operation is possible with the use of the VDD potential instead of with the use of the VPP potential. However, with the use of the VPP potential, it is possible to lower the on-resistance of the NMOS transistor, whose gate is supplied with the VPP potential, thereby assuring the operational margin.

Figure 5:
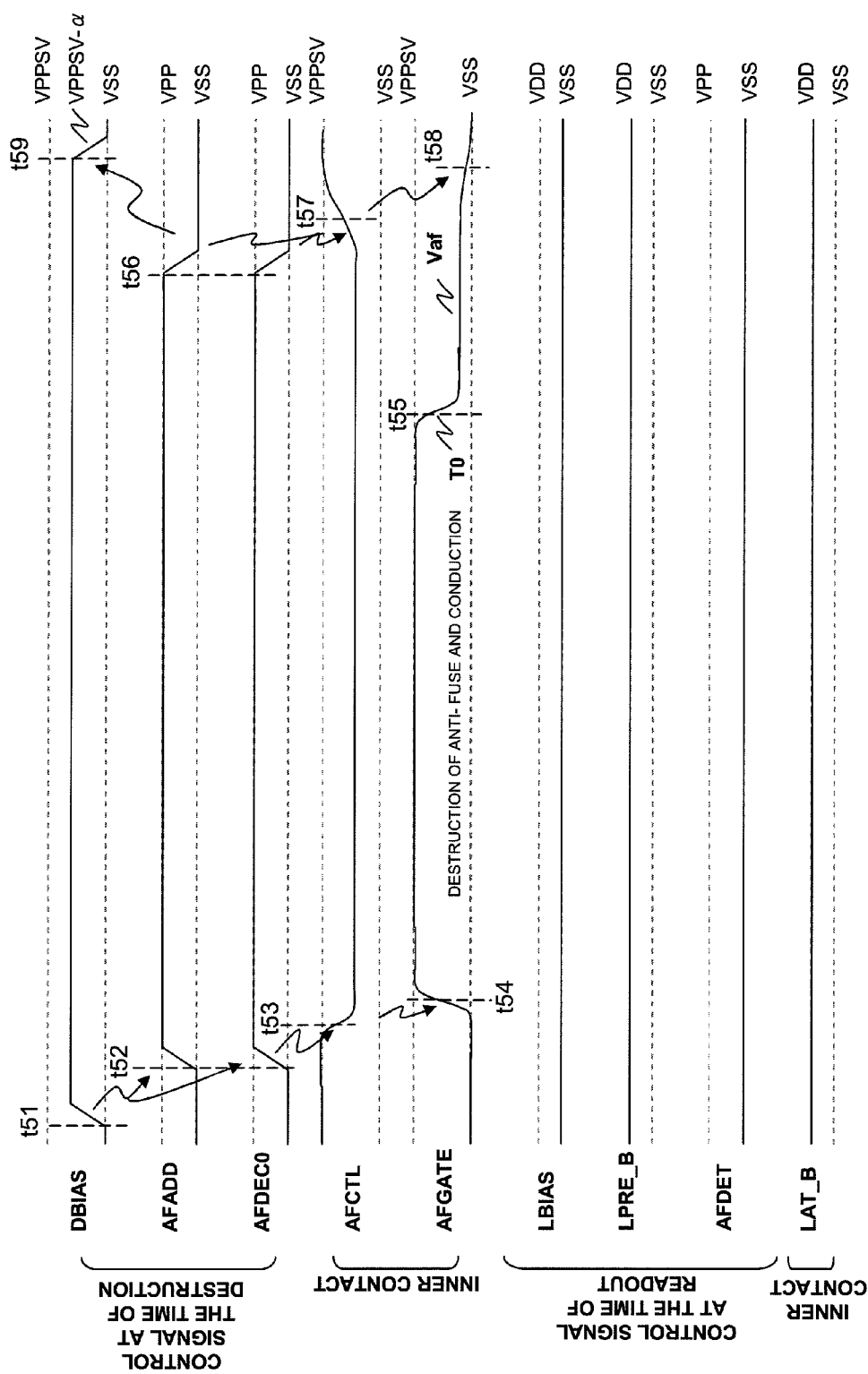
FIG. 5 is a timing chart for illustrating the write operation in case where an anti-fuse element is rendered electrically conductive.

FIG. 5 depicts a timing chart for a case in which, in Example 1, the anti-fuse element is to be made electrically conductive. It is observed that, during the write operation, the decision clock signal AFDET is at the VSS potential, at all times, and hence the input transistor NH3 of the decision circuit 22 is off at all times. The decision circuit 22 is, therefore, disconnected from the anti-fuse element Maf. At a timing t51, the load voltage adjustment signal DBIAS, supplied to the decoding circuit 21 of FIG. 1, rises from the VSS potential to a VPPSV-α potential, where 'α' is a voltage determined by the load voltage generation circuit 24 shown in FIG. 4. The voltage 'α' is set to a voltage not lower than the threshold voltage of the load transistor PH1 and only weakly turns the load transistor PH1 on. At a timing t52 after rise of the load voltage adjustment signal DBIAS, the selection signals AFADD and AFDEC0 rise from the VSS potential to the VPP potential. After rise of the selection signals AFADD and AFDEC0, the decoding circuit 21 is set into operation. At a timing t53, the control node AFCTL, which is to be a gate signal for the driver transistor PH0, falls from the VPPSV potential to a voltage determined by the ratio of the on-resistances of the load transistor PH1 and the selection transistors NH1, NH2. Then, at a timing t54, the driver transistor PH0 is turned on. The gate signal AFGATE of the anti-fuse rises to a VPPSV potential. Since the VBBSV potential, which is a negative potential, is applied to the source/drain of the anti-fuse element Maf, a high voltage is applied across the terminals of the anti-fuse element Maf. At a timing t55, the anti-fuse element Maf is destructed by this application of the HIGH voltage. The current path AFGATE-VBBSV is shorted via the anti-fuse element Maf, and hence the potential at AFGATE is lowered to close to the VSS potential. At this time, the load transistor PH1 has been turned on weakly, while the selection transistors NH1, NH2 are sufficiently turned on. Hence, the control node AFCTL is approximately 0V, so that a sufficient current may flow through the driver transistor PH0. It is thus possible to render the current path between the gate AFGATE of the anti-fuse element Maf and the source/drain VBBSV electrically conductive at a low resistance.

Since timing t56 begins the sequence of the end of the write operation. Initially, at a timing t56, the selection signals AFADD and AFDEC0 fall from the VPP potential to the VSS potential. Then, at a timing t57, the potential of the control node AFCTL, which is the gate potential of the driver transistor PH0, rises to the VPPSV potential. This causes the driver transistor PH0 to be turned off. Thus, at a timing t58, the potential at AFGATE is lowered to approximately equal to the VSS potential. At a timing t59, the AFGATE potential falls to approximately equal to the VSS potential. At a timing t59, the DBIAS signal, output by the load voltage generation circuit 24, also falls to the VSS terminal. This terminates the write operation. It is observed that, since the time for destructing the anti-fuse element to perform programming is on the order of several μsec, the time until restoration of the DBIAS signal is not of a problem.

Figure 6:
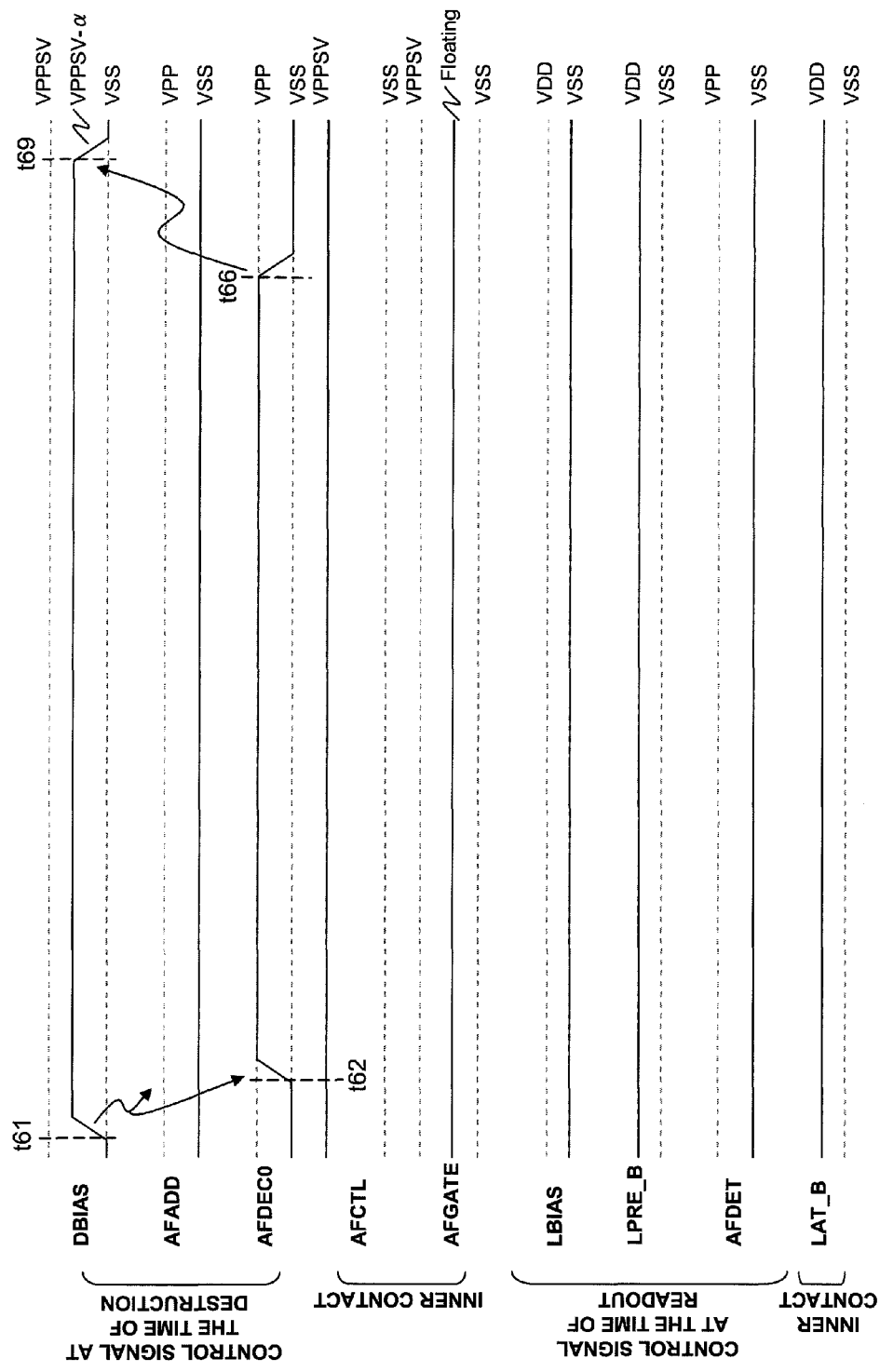
FIG. 6 is a timing chart for illustrating the write operation in case where an anti-fuse element is not rendered electrically conductive.

FIG. 6 depicts a timing diagram for a case in which the anti-fuse element is not to be rendered electrically conductive during the write operation of Example 1. At a timing t61, the load voltage adjustment signal DBIAS, supplied to the decoding circuit 21 of FIG. 1, rises from the VSS potential to a VPPSV-α potential. Up to this time point, the operation is the same as that of the timing chart of FIG. 5. After rise of the load voltage adjustment signal DBIAS, the selection signal AFDEC0 rises, at a timing t62, from the VSS potential to the VPP potential. The selection signal AFADD remains at the VSS potential. Thus, in a manner different from FIG. 5, the control node AFCTL, which is the output signal of the decoding circuit 21, is kept at the VPPSV potential. The driver transistor PH0, therefore, is not turned on. Hence, the gate potential AFGATE of the anti-fuse element Maf is in a floating state without being supplied with a high voltage. Consequently, the anti-fuse element Maf is not destructed, with the gate AFGATE and the source/drain VBBSV being kept in a state of high impedance. At a timing t66, the selection signal AFDEC0 falls from the VPP potential to the VSS potential and, at a timing t69, the load voltage adjustment signal DBIAS also falls to the VSS potential to terminate the write operation.

Figure 7:
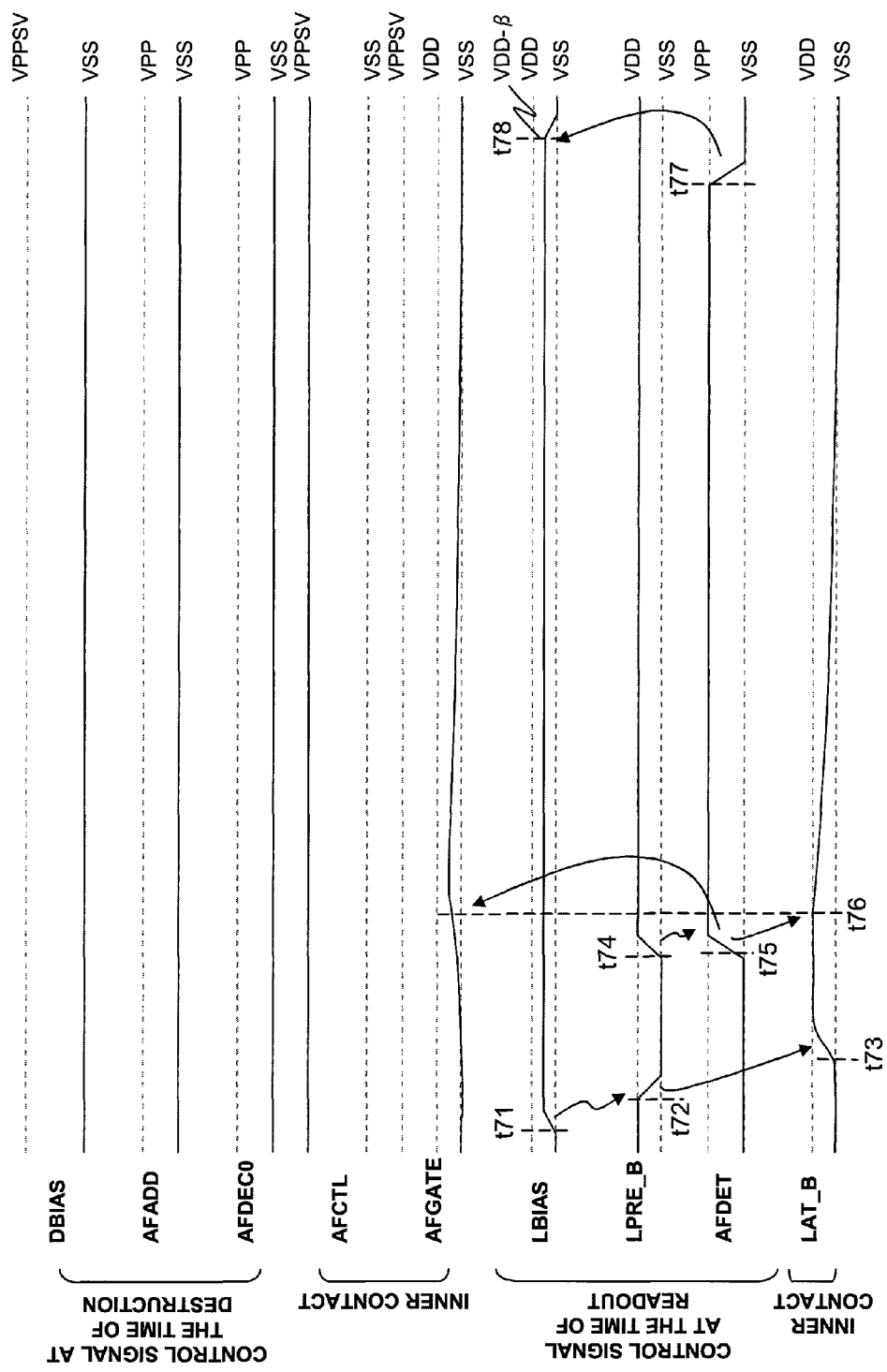
FIG. 7 is a timing chart showing the operation of reading out an electrically conductive anti-fuse element according to the Example of the present invention.

FIG. 7 depicts a timing chart showing the readout operation for the electrically conductive anti-fuse element of Example 1. During the readout operation, the load voltage adjustment signal DBIAS and the selection signals AFADD and AFDEC0 are at the VSS potential at all times. Hence, the control node AFCTL of the driver transistor PH0 is at the VPPSV potential at all times. The driver transistor PH0 is thus off at all times.

In the initial state, the decision clock signal AFDET is at a VSS potential. The decision circuit 22 is thus disconnected from the anti-fuse element Maf. Initially, at a timing t71, the decision current adjustment signal LBIAS, output from the decision voltage generation circuit 23, shown in FIG. 3, rises from the VSS potential to the VDD-β potential, where 'β' is a voltage determined by the decision voltage generation circuit 23. This voltage 'β' is set to a value not lower than the threshold voltage value of the PMOS transistor PL3 to turn on the load transistor PL3 only weakly. Then, at a timing t72, the pre-charge signal LPRE_B is lowered from the VDD potential to the VSS potential to turn on the PMOS transistor PL12. Then, at a timing t73, a potential decision node LAT_B rises to the VDD potential. When the potential decision node LAT_B rises to the VDD potential, the output of the inverter IL1 falls from the VDD potential to the VSS potential. The NMOS transistor NL1 is thus turned off, while the PMOS transistor PL1 is turned on.

Then, at a timing t74, the pre-charge signal LPRE_B is raised from the VSS potential to the VDD potential. At a timing t75, the decision clock signal AFDET is raised from the VSS potential to the VPP potential to turn on the input transistor NH3. At a timing t76, electrical charges are moved from the potential decision node LAT_B via the input transistor NH3 to the gate potential AFGATE of the anti-fuse element Maf. The potential at the potential decision node LAT_B thus falls from the VDD potential, and the potential at AFGATE rises, so that the potential at LAT_B is approximately equal to that at AFGATE. As from timing t76, the potential at the potential decision node LAT_B and that at AFGATE are determined by the current flowing from the VDD power supply via the PMOS transistor PL1, PMOS transistor PL3, input transistor NH3 and the anti-fuse element Maf to VBBSV. During readout, VBBSV is at the same potential as VSS. It is also observed that the decision current adjustment signal LBIAS, output from the decision voltage generation circuit 23, shown in FIG. 3, is delivered to the gate of the PMOS transistor PL3. Thus, by adjusting the voltage level of the decision current adjustment signal LBIAS by the decision voltage generation circuit 23, the value of the current about to flow from the decision circuit 22 into the anti-fuse element Maf may be adjusted, with the result that the potential difference generated at the anti-fuse element Maf may be determined by the decision circuit 22 based on the current caused to flow from the decision circuit 22 into the anti-fuse element Maf.

In case the anti-fuse element Maf is in a conducting state, the potential at the potential decision node LAT_B and at AFGATE is gradually lowered towards the VSS potential. When the potential has lowered to a preset value, the operation of the inverter IL1 is inverted to turn the PMOS transistor PL1 and the NMOS transistor NL1 off and on, respectively. The potential at the potential decision node LAT_B is thus stable at the VSS potential.

At a timing t77, the decision clock signal AFDET is lowered from the VPP potential to the VSS potential and, at a timing t78, the decision current adjustment signal LBIAS is also lowered to the VSS potential to terminate the readout operation.

Figure 8:
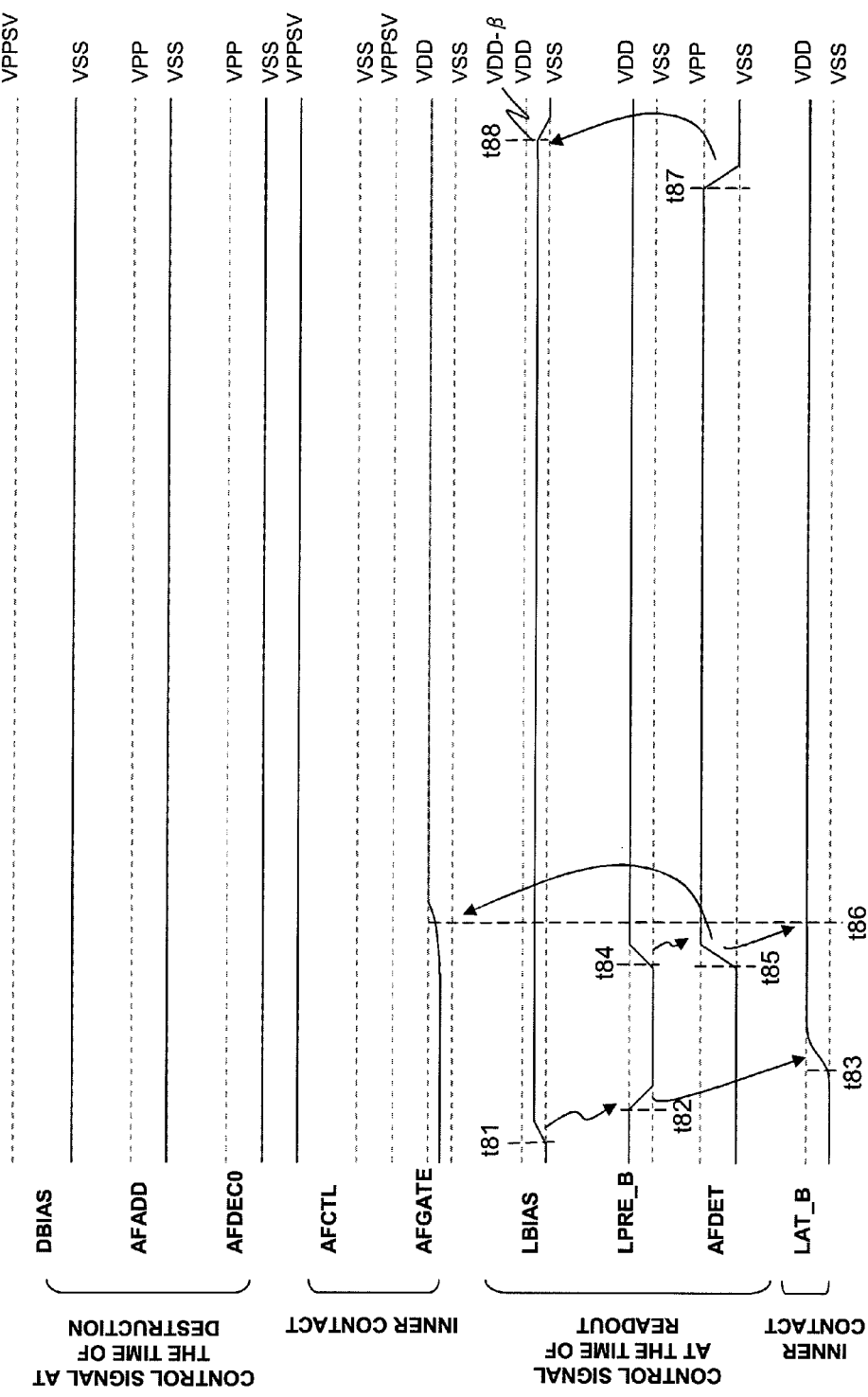
FIG. 8 is a timing chart showing the operation of reading out an electrically nonconductive insulated anti-fuse element according to the Example of the present invention.

FIG. 8 is a timing chart showing the operation of reading out the anti-fuse element, which is not electrically conductive but is insulated in FIG. 1. The timing chart of FIG. 8 is basically the same as that of FIG. 7. However, since the gate and the source/drain of the anti-fuse element Maf are isolated relative to each other, no current flows via the anti-fuse element Maf to the VBBSV potential even if the decision clock signal AFDET is raised from the VSS potential to the VPP potential at a timing t85 to turn on the input transistor NH3. Hence, at a timing t86, electrical charges are moved from the potential decision node LAT_B to the gate potential AFGATE of the anti-fuse element Maf to raise the potential at AFGATE. However, the potential at the potential decision node LAT_B is not lowered, and is kept at the VDD potential. It is because the current is supplied from the power supply VDD via the PMOS transistors PL1 and PL3. The output of the inverter IL1 is thus kept at the VSS potential, and hence the PMOS transistor PL1 is kept in on-state and the NMOS transistor NL1 is kept in off-state. Consequently, after the decision clock signal AFDET is lowered to the VSS potential at a timing t87 to terminate the readout operation, the decision circuit is maintained in a stabilized state of outputting the low level as the output signal LAT_T. Finally, at a timing t88, the decision current adjustment signal LBIAS is raised to the VSS potential to terminate the readout operation.

Example 2

FIG. 9 depicts a circuit diagram of the vicinity of the anti-fuse element in the semiconductor device of Example 2. It is observed that, in Example 1, the driver transistor, interposed between the VPPSV power supply and the gate of the anti-fuse element Maf, is composed of a single transistor. However, in case the on-resistance of the driver transistor is sufficiently low, such that, even if a plurality of transistors are interposed between the VPPSV power supply and the gate of the anti-fuse element Maf, the anti-fuse element can be sufficiently destructed so as to be thereby rendered electrically conductive, the driver transistor may be composed of a series connection of a plurality of transistors.

In this case, the series-connected multiple transistors are provided with the functions of the both driver transistor and the decoding circuit to reduce the size of the anti-fuse circuit. Example 2 is an Example configured for such case.

In an anti-fuse circuit 26, shown in FIG. 9, a decoder/driver bi-functional circuit 25 is used in substitution for the driver transistor PH0 and the decoding circuit 21 of the anti-fuse circuit 7 of Example 1 shown in FIG. 1. Otherwise, the anti-fuse circuit 26 is the same as the anti-fuse circuit 7. The decoder/driver bi-functional circuit 25 has the functions of both the driver transistor PH0 and the decoding circuit 21 of Example 1. The decoder/driver bi-functional circuit 25 is composed of decoder/driver bi-functional transistors (thick film PMOS transistors) PH2, PH3, connected in series with each other.

Selection signals AFADD_B, AFDEC0_B, delivered to the decoder/driver bi-functional circuit 25, are equivalent to the selection signals AFADD, AFDEC0 of Example 1. However, the selection signals AFADD and AFDEC0 of Example 1 are non-inverted signals associated with the power supply VPP, and the selection signals AFADD_B, AFDEC0_B of Example 2 are inverted signals associated with the power supply VPPSV. Thus, if both the selection signals AFADD_B, AFDEC0_B are low in level (at VSS potential), transistors PH2, PH3 are both turned on to destruct the anti-fuse element Maf to render it electrically conductive. If one of the selection signals AFADD_B, AFDEC0_B is at the VPPSV potential, writing in the anti-fuse element Maf is not made.

Moreover, the decoder/driver bi-functional circuit 25 of Example 2 does not include the function of adjusting the voltage level of the DBIAS signal to control the bias voltage of the driver transistor, as in Example 1. Consequently, the load voltage generation circuit shown in FIG. 4 may be dispensed with. Other constructions and operations, such as decision circuit or the readout operation, are the same as those of FIG. 1 and hence the detailed description therefor is dispensed with.

In this Example 2, the driver transistor also performs the function of the decoding circuit. Hence, the present Example has an advantage that the anti-fuse circuit 26 in its entirety may be constructed by a smaller number of constituent elements.

In the foregoing description of the Examples, a semiconductor device in which the anti-fuse element is used for selecting redundant memories is described as Example of the present invention. The semiconductor device of the present invention is, however, not restricted to such a configuration in which the anti-fuse element is used for selecting the redundant memories. For example, the anti-fuse element may be used for adjustment or selection of circuit characteristics, intrinsic information, such as device types or production lots numbers, or the customer information optionally selected by the customers. The present invention may be applied to a semiconductor device provided with such anti-fuse elements.

In the semiconductor device of each of the above Examples, it is not always necessary to set the VBBSV potential so as to be lower than the VSS potential for writing in an anti-fuse element. If the anti-fuse element may be made electrically conductive with the VBBSV potential equal to the VSS potential, the VBBSV potential may be made equal to the VSS potential to render the anti-fuse element electrically conductive. It is however necessary that the VBBSV potential may be made lower than the VSS potential as necessary. For example, there may be such a case in which, due to variations in the voltage withstand properties of the anti-fuse element or a peripheral circuit, an anti-fuse element may not be made electrically conductive with the VBBSV potential equal to the VSS potential. In such case, the anti-fuse element may be rendered electrically conductive by setting the VBBSV potential so as to be lower than the VSS potential without applying a further higher voltage to the VPPSV potential. The anti-fuse element may thus be rendered electrically conductive without applying a stress to the peripheral circuit to more than a necessary extent.

Moreover, with the above Example 1, the driver transistor PH0 may be made the sole component interposed between the VPPSV potential and the VBBSV potential, if the anti-fuse element so interposed is discounted. Hence, the potential difference between the VPPSV potential and the VBBSV potential, except the voltage drop by the driver transistor, may be applied to the anti-fuse element to render it electrically conductive. It is therefore unnecessary to apply a voltage higher than is necessary to the peripheral circuit of the anti-fuse element.

Although the present invention has so far been described with reference to preferred embodiments, the present invention is not to be restricted to the embodiments. It is to be appreciated that those skilled in the art can change or otherwise correct the embodiments without departing from the spirit and the scope of the present invention.

For example, a semiconductor device embodying the present invention may be an embedded transistor or a vertical transistor embedded in or vertically arranged on a semiconductor substrate. The method for producing the semiconductor device embodying the present invention may be directed to this embedded or vertical transistor. In addition, the anti-fuse element of the transistor structure may be the same as the transistors of the peripheral circuit. That is, the anti-fuse element may be of the MOS type, MIS type or other types of transistors.

Preferable modes of the present invention are summarized in the following.
(Mode 1): as Mentioned as the First Aspect.
(Mode 2):
The semiconductor device according to mode 1 further comprising:
a load voltage generation circuit that divides the voltage of said third power supply and that of said second power supply;
an output of said load voltage generation circuit being connected to the gate of said load transistor.
(Mode 3):
The semiconductor device according to mode 1 or 2 wherein said decision circuit includes an input transistor composed of a high withstand voltage MOS transistor;
one end of said input transistor being connected to one end of said anti-fuse element; the other end of said input transistor being connected to a potential decision node of said decision circuit.
(Mode 4):
The semiconductor device according to mode 3, wherein said decision circuit includes a decision current adjustment signal coupled to said decision circuit and a latch circuit connected to said potential decision node; and wherein
said decision current adjustment signal restricts the current flowing through a feedback element of said latch circuit; and said decision circuit makes said decision by a potential generated at said potential decision node.
(Mode 5):
The semiconductor device according to mode 4, wherein said latch circuit includes a current limiting transistor connected in series with said feedback element; said decision current adjustment signal being coupled to the gate of said current limiting transistor.
(Mode 6):
The semiconductor device according to mode 5, wherein one of said feedback element and said current limiting transistor, connected in series with each other, is connected to said first power supply; the other being connected to said potential decision node.

(Mode 7):

The semiconductor device according to claim 3, wherein said decision circuit includes a decision current adjustment signal;

a current adjusted by said decision current adjustment signal being caused to flow via said potential decision node to said anti-fuse element; said decision circuit making said decision based on a potential difference generated in said potential decision node.

(Mode 8):

The semiconductor device according to mode 7, wherein said decision circuit further includes a latch circuit run in operation by said first and second power supplies;

said latch circuit being activated by a potential generated at said potential decision node in association with said current adjusted by said decision current adjustment signal.

(Mode 9):

The semiconductor device according to mode 3, further comprising:

a decision current adjustment signal coupled to said decision circuit;

said decision circuit causing said current adjusted by said decision current adjustment signal to flow via said potential decision node to said anti-fuse element; said decision circuit making said decision based on a potential generated.

(Mode 10):

The semiconductor device according to any one of modes 4 to 9, further comprising:

a decision voltage generation circuit dividing a voltage of said first power supply and a voltage of said second power supply;

said decision voltage generation circuit outputting said decision current adjustment signal.

(Mode 11):

The semiconductor device according to any one of modes 1 to 10, wherein said anti-fuse element is a MOS transistor whose gate is connected to said one end and whose source and drain are connected to said other end.

(Mode 12):

The semiconductor device according to any one of modes 1 to 11, further comprising:

a memory cell array and a peripheral circuit that control access to memory cells of said memory cell array from outside;

said anti-fuse element comprising a MOS transistor of the same configuration as the MOS transistor used in said peripheral circuit.

(Mode 13):

The semiconductor device according to any one of modes 1 to 12, wherein said driver transistor comprises a high withstand voltage MOS transistor and said anti-fuse element comprises a low withstand voltage MOS transistor.

(Mode 14): as Mentioned as the Second Aspect.

(Mode 15):

The semiconductor device according to mode 14, wherein the voltages of said first to fourth power supplies are set so that said voltages become lower in the sequence of said third power supply, said first power supply, said second power supply and said fourth power supply to render said anti-fuse element electrically conductive.

(Mode 16):

The semiconductor device according to mode 14 or 15 further comprising:

a load voltage generation circuit that divides the voltage of said third power supply and the voltage of said second power supply;

an output of said load voltage generation circuit being connected to the gate of said load transistor.

(Mode 17):

The semiconductor device according to any one of modes 14 to 16, wherein said anti-fuse element is a MOS transistor whose gate is connected to said one end and whose source and drain are connected to said other end.

(Mode 18):

The semiconductor device according to any one of modes 14 to 17, wherein said decision circuit includes an input transistor whose source or drain is connected to one end of said anti-fuse element and whose drain or source is connected to a potential decision node of said decision circuit;

said driver transistor and said input transistor each comprising a high withstand voltage MOS transistor;

said anti-fuse element comprising a low withstand voltage MOS transistor.

(Mode 19):

The semiconductor device according to mode 18 wherein a gate of said input transistor is coupled to a decision clock signal;

said decision circuit latching the result of decision in synchronization with said decision clock signal.

(Mode 20):

The semiconductor device according to any one of modes 14 to 19 further comprising:

a memory cell array and a peripheral circuit that controls access to memory cells of said memory cell array from outside;

said anti-fuse element comprising a MOS transistor of the same configuration as MOS transistors used in said peripheral circuit.

(Mode 21):

The semiconductor device according to any one of modes 14 to 20; wherein a decision current adjustment signal is coupled to said decision circuit;

said decision circuit causing a current adjusted by said decision current adjustment signal to flow via said potential decision node to said anti-fuse element; said decision circuit making a decision based on a potential generated.

(Mode 22):

The semiconductor device according to mode 21, further comprising:

a decision voltage generation circuit dividing a voltage of said first power supply and a voltage of said second power supply;

said decision voltage generation circuit outputting said decision current adjustment signal.

(Mode 23):

The semiconductor device according to any one of modes 14 to 22 further comprising:

a semiconductor substrate and a plurality of interconnect layers;

the gate of said anti-fuse element being connected, using only the lowermost one of said multiple interconnect layers, at least one point to said semiconductor substrate.

(Mode 24):

The semiconductor device according to any one of modes 14 to 23 wherein said first to fourth power supplies are connected to first to fourth power supply pads, respectively;

said first and second power supply pads being connected to power supply lines provided outside of said semiconductor device;

said third and fourth power supply pads not being connected to said power supply lines provided outside of said semiconductor device but being connected to a supply power generation circuit configured so that said third and fourth power supplies will generate power supply voltages within said semiconductor device.

(Mode 25): as Mentioned as the Third Aspect.

(Additional Mode 26)

In connection with a semiconductor device including a driver transistor whose source is connected to a first node and whose gate is connected to a control node and an anti-fuse element whose one end is connected to the drain of said driver transistor and whose other end is connected to a second node, a method for programming the anti-fuse element in said semiconductor device, wherein a voltage outside the voltage range of said first and second power supplies is applied to said first node and another voltage outside the voltage range of said first and second power supplies is applied to said second node; a voltage at said control node being controlled to render said anti-fuse element electrically conductive.

(Additional Mode 27)

The programming method according to Additional mode 26 in which said semiconductor device includes a plurality of sets each composed of said driver transistor and said anti-fuse element, a memory cell array and a redundant memory cell;

said method comprising the steps of:

performing a functional test of said memory cell array; and deciding a memory cell to be replaced by said redundant memory cell if, as a result of a functional test on said memory cell array, said memory cell array suffers a functional deficiency, and making one anti-fuse element selected from said multiple anti-fuse elements electrically conductive in association with said memory cell.

(Additional Mode 28)

The programming method according to Additional mode 26 or 27 further comprising the step of applying said voltages outside said voltage range from a pad of said semiconductor device in the state of a wafer or a pellet to said first node and to said second node to render said anti-fuse element electrically conductive.

(Additional Mode 29)

The programming method according to any one of Additional modes 26 to 28 wherein said semiconductor device includes a supply power generation circuit for generating said voltages outside said voltage range at said first and second nodes; said method comprising a step of:

setting said supply power generation circuit in operation to render said anti-fuse element electrically conductive after assembling said semiconductor device into a package.

(Additional Mode 30)

A method for producing a semiconductor device that includes an anti-fuse element; said semiconductor device being in operation during the normal operation by being supplied with power from first and second power supplies;

said method comprising the steps of:

forming, on said semiconductor substrate, a driver transistor whose source is connected to a first node and whose gate is connected to a control node, and an anti-fuse element whose one end is connected to the drain of said driver transistor and whose other end is connected to said second node; and a step of applying the voltages outside the voltage range of said first and second power supplies to said first and second nodes to control the voltages at said control node to render said anti-fuse element electrically conductive.

(Additional Mode 31)

The method for producing a semiconductor device according to Additional mode 30, wherein said step of forming said driver transistor and said anti-fuse element on said semiconductor substrate includes a sub-step of forming a plurality of sets each composed of said driver transistors and said anti-fuse elements, and also forming a memory cell array and a redundant memory cell on said semiconductor substrate, in order to perform a functional test of said memory cell array; and wherein in said step to render the memory cell electrically conductive, the memory cell to be replaced by said redundant memory cell is decided based on the result of said functional test; the anti-fuse element selected out of said multiple anti-fuse elements being rendered electrically conductive in association with said memory cell.

(Additional Mode 32)

The method for producing a semiconductor device according to Additional mode 30 or 31, further comprising the step of:

applying said voltages outside said voltage range from a pad of said semiconductor device in the state of a wafer or a pellet to said first and second nodes to render said anti-fuse element electrically conductive.

(Additional Mode 33)

The method for producing a semiconductor device according to any one of Additional modes 30 to 32 in which said semiconductor device includes a supply power generation circuit for generating said voltages outside said voltage range at said first and second nodes; said method further comprising the step of:

setting said supply power generation circuit into operation after assembling said semiconductor device into a package to render said anti-fuse element electrically conductive.

(Additional Mode 34)

A semiconductor device comprising: an anti-fuse element and run in operation by being supplied with power from said first and second power supplies;

a first driver transistor whose source is connected to a third power supply and whose gate is connected to a first selection signal;

a second driver transistor whose source is connected to said first driver transistor and whose gate is coupled to a second selection signal;

an anti-fuse element whose one end is connected to a drain of said second driver transistor and whose other end is connected to a fourth power supply; and a decision circuit connected to said first and second power supplies to decide the resistance value of said anti-fuse element; wherein said first to fourth power supplies are supplied with voltages so that, out of potential differences between two of said first to fourth power supplies, the potential difference between said third and fourth power supplies will be the maximum; said first and second selection signals being controlled to render said anti-fuse element electrically conductive to destruct said anti-fuse element to render the element electrically conductive.

(Additional Mode 35)

The semiconductor device according to Additional mode 34, wherein said first and second driver transistors are also used as decoding circuits; said first and second selection signals being selection signals of said decoding circuits.

(Additional Mode 36)

The semiconductor device according to Additional mode 34 or 35, wherein said first to fourth power supplies are supplied with voltages decreasing in the sequence of the third, first, second and fourth power supplies to destruct said anti-fuse element to render the element electrically conductive.

(Additional Mode 37)

The semiconductor device according to any one of Additional modes 34 to 36, wherein a further driver transistor, connected in series with said first and second driver transistors, is provided between said third power supply and one end of said anti-fuse element, the gate of said further driver transistor being coupled to a selection signal different from said first and second selection signals.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a first power supply of a high potential;
   a second power supply of a low potential;
   a third power supply of a potential higher than said first power supply;
   a fourth power supply of a potential lower than said second power supply;
   an anti-fuse element having a node at one end thereof and having another node at the other end thereof; said other end being connected to said fourth power supply;
   a driver transistor whose source is connected to said third power supply, whose gate is connected to a control node and whose drain is connected to said one end of said anti-fuse element;
   a decoding circuit including a load transistor connected between said third power supply and said control node and at least one selection transistor connected between said second power supply and said control node; and
   a decision circuit connected to said first and second power supplies; so as to decide a resistance value of said anti-fuse element; wherein
   said anti-fuse element is rendered electrically conductive in response to activation of said driver transistor as selected by said decoding circuit, and said decision circuit makes a decision as to whether or not said anti-fuse element has been rendered electrically conductive.

2. The semiconductor device according to claim 1 further comprising:
   a load voltage generation circuit that divides the voltage of said third power supply and that of said second power supply;
   an output of said load voltage generation circuit being connected to the gate of said load transistor.

3. The semiconductor device according to claim 1 wherein said decision circuit includes an input transistor composed of a high withstand voltage MOS transistor;
   one end of said input transistor being connected to one end of said anti-fuse element; the other end of said input transistor being connected to a potential decision node of said decision circuit.

4. The semiconductor device according to claim 3, wherein said decision circuit includes a decision current adjustment signal coupled to said decision circuit and a latch circuit connected to said potential decision node; and wherein said decision current adjustment signal restricts the current flowing through a feedback element of said latch circuit; and said decision circuit makes said decision by a potential generated at said potential decision node.

5. The semiconductor device according to claim 4, wherein said latch circuit includes a current limiting transistor connected in series with said feedback element; said decision current adjustment signal being coupled to the gate of said current limiting transistor.

6. The semiconductor device according to claim 5, wherein one of said feedback element and said current limiting transistor, connected in series with each other, is connected to said first power supply; the other being connected to said potential decision node.

7. The semiconductor device according to claim 3, wherein said decision circuit includes a decision current adjustment signal;
   a current adjusted by said decision current adjustment signal being caused to flow via said potential decision node to said anti-fuse element; said decision circuit making said decision based on a potential difference generated in said potential decision node.

8. The semiconductor device according to claim 7, wherein said decision circuit further includes a latch circuit run in operation by said first and second power supplies;
   said latch circuit being activated by a potential generated at said potential decision node in association with said current adjusted by said decision current adjustment signal.

9. The semiconductor device according to claim 3, further comprising:
   a decision current adjustment signal coupled to said decision circuit;
   said decision circuit causing a current adjusted by said decision current adjustment signal to flow via said potential decision node to said anti-fuse element; said decision circuit making said decision based on a potential generated.

10. The semiconductor device according to claim 4, further comprising:
    a decision voltage generation circuit dividing a voltage of said first power supply and a voltage of said second power supply;
    said decision voltage generation circuit outputting said decision current adjustment signal.

11. The semiconductor device according to claim 1, wherein
    said anti-fuse element is a MOS transistor whose gate is connected to said one end and whose source and drain are connected to said other end.

12. The semiconductor device according to claim 1, further comprising:
    a memory cell array and a peripheral circuit that control access to memory cells of said memory cell array from outside;
    said anti-fuse element comprising a MOS transistor of the same configuration as the MOS transistor used in said peripheral circuit.

13. The semiconductor device according to claim 1, wherein
    said driver transistor comprises a high withstand voltage MOS transistor and said anti-fuse element comprises a low withstand voltage MOS transistor.

14. A semiconductor device including an anti-fuse element and run in operation by a power supplied from a first and a second power supplies; comprising:
- a driver transistor whose source is connected to a third power supply and whose gate is connected to a control node;
- an anti-fuse element whose one end is connected to a drain of said driver transistor and whose other end is connected to a fourth power supply;
- a decision circuit connected to said first and second power supplies to decide a resistance value of said anti-fuse element; and
- a decoding circuit including a load transistor connected between said third power supply and said control node, and a plurality of selection transistors connected between said second power supply and said control node;
- voltages of said third and fourth power supplies being voltages outside a voltage range between said first and second power supplies to allow for electrical conduction of said anti-fuse element.

15. The semiconductor device according to claim 14, wherein
the voltages of said first to fourth power supplies are set so that said voltages become lower in the sequence of said third power supply, said first power supply, said second power supply and said fourth power supply to render said anti-fuse element electrically conductive.

16. The semiconductor device according to claim 14 further comprising:
- a load voltage generation circuit that divides the voltage of said third power supply and the voltage of said second power supply;
- an output of said load voltage generation circuit being connected to the gate of said load transistor.

17. The semiconductor device according to claim 14, wherein
said anti-fuse element is a MOS transistor whose gate is connected to said one end and whose source and drain are connected to said other end.

18. The semiconductor device according to claim 14, wherein
- said decision circuit includes an input transistor whose source or drain is connected to said one end of said anti-fuse element and whose drain or source is connected to a potential decision node of said decision circuit;
- said driver transistor and said input transistor each comprising a high withstand voltage MOS transistor;
- said anti-fuse element comprising a low withstand voltage MOS transistor.

19. The semiconductor device according to claim 18 wherein
- a gate of said input transistor is coupled to a decision clock signal; and
- said decision circuit latches the result of decision in synchronization with said decision clock signal.

20. The semiconductor device according to claim 14 further comprising:
- a memory cell array and a peripheral circuit that controls access to memory cells of said memory cell array from outside;
- said anti-fuse element comprising a MOS transistor of the same configuration as MOS transistors used in said peripheral circuit.

21. The semiconductor device according to claim 14; wherein a decision current adjustment signal is coupled to said decision circuit;
- said decision circuit causes a current adjusted by said decision current adjustment signal to flow via said potential decision node to said anti-fuse element; and
- said decision circuit makes a decision based on a potential generated by said current.

22. The semiconductor device according to claim 21, further comprising:
- a decision voltage generation circuit that divides a voltage of said first power supply and a voltage of said second power supply;
- said decision voltage generation circuit that outputs said decision current adjustment signal.

23. The semiconductor device according to claim 14 further comprising:
- a semiconductor substrate and a plurality of interconnect layers;
- the gate of said anti-fuse element being connected, using only the lowermost one of said multiple interconnect layers, at least one point to said semiconductor substrate.

24. The semiconductor device according to claim 14, further comprising:
- a supply power generation circuit that generates said third and forth power supplies; wherein
- said first to fourth power supplies are connected to first to fourth power supply pads, respectively;
- said first and second power supply pads being connected to power supply lines provided outside of said semiconductor device;
- said third and fourth power supply pads not being connected to said power supply lines provided outside of said semiconductor device but being connected to said supply power generation circuit.

25. A semiconductor device run in operation by being supplied with the power from a first power supply and from a second power supply lower in supply voltage value than said first power supply; said semiconductor device comprising:
- an anti-fuse element;
- a plurality of drive transistors whose gates are coupled to selection signals and whose sources and drains are interconnected in series; and
- a decision circuit connected to said first and second power supplies to decide a resistance value of said anti-fuse element;
- said plurality of drive transistors, with sources and drains connected in series, and said anti-fuse element, being interconnected in series between a first node and a second node;
- said plurality of drive transistors being also used as a decoding circuit;
- said selection signals being selected so that, for said anti-fuse element to be electrically conductive, said drive transistors connected in series with said anti-fuse element will be made electrically conductive in their entirety; said first node being supplied with a voltage higher than the voltage of said first power supply; said second node being supplied with a voltage lower than the voltage of said second power supply to render said anti-fuse element electrically conductive.

* * * * *